United States Patent
Sel et al.

(10) Patent No.: US 9,601,508 B2
(45) Date of Patent: Mar. 21, 2017

(54) BLOCKING OXIDE IN MEMORY OPENING INTEGRATION SCHEME FOR THREE-DIMENSIONAL MEMORY STRUCTURE

(71) Applicant: SANDISK TECHNOLOGIES INC., Plano, TX (US)

(72) Inventors: Jongsun Sel, Los Gatos, CA (US); Chan Park, Mountain View, CA (US); Atsushi Suyama, San Jose, CA (US); Frank Yu, Cupertino, CA (US); Hiroyuki Ogawa, Nagoya (JP); Ryoichi Honma, Yokkaichi (JP); Kensuke Yamaguchi, Yokkaichi (JP); Hiroaki Iuchi, Nagoya (JP); Naoki Takeguchi, Yokkaichi (JP); Tuan Pham, San Jose, CA (US); Kiyohiko Sakakibara, Yokkaichi (JP); Jiao Chen, Yokkaichi (JP)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 14/921,385

(22) Filed: Oct. 23, 2015

(65) Prior Publication Data
US 2016/0315095 A1 Oct. 27, 2016

Related U.S. Application Data

(60) Provisional application No. 62/153,396, filed on Apr. 27, 2015.

(51) Int. Cl.
*H01L 27/115* (2006.01)
*H01L 29/04* (2006.01)
(Continued)

(52) U.S. Cl.
CPC .... *H01L 27/11582* (2013.01); *H01L 21/0217* (2013.01); *H01L 21/02164* (2013.01);
(Continued)

(58) Field of Classification Search
CPC ......... H01L 27/11578; H01L 27/11582; H01L 27/11519; H01L 27/11556
See application file for complete search history.

(56) References Cited

U.S. PATENT DOCUMENTS 5,084,417 A    1/1992   Joshi et al.
5,807,788 A    9/1998   Brodsky et al.
(Continued)

FOREIGN PATENT DOCUMENTS

WO    WO 02/15277 A2    2/2002

OTHER PUBLICATIONS

Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.
(Continued)

*Primary Examiner* — Douglas Menz
(74) *Attorney, Agent, or Firm* — The Marbury Law Group PLLC

(57) ABSTRACT

An alternating stack of insulating layers and sacrificial material layers is formed over a substrate. After formation of a memory opening, all surfaces of the memory opening are provided as silicon oxide surfaces by formation of at least one silicon oxide portion. A silicon nitride layer is formed in the memory opening. After formation of a memory stack structure, backside recesses can be formed employing the silicon oxide portions as an etch stop. The silicon oxide portions can be subsequently removed employing the silicon nitride layer as an etch stop. Physically exposed portions of
(Continued)

the silicon nitride layer can be removed selective to the memory stack structure. Damage to the outer layer of the memory stack structure can be minimized or eliminated by successive use of etch stop structures. Electrically conductive layers can be subsequently formed in the backside recesses.

15 Claims, 26 Drawing Sheets

(51) Int. Cl.
H01L 29/16 (2006.01)
H01L 21/02 (2006.01)
H01L 29/788 (2006.01)
H01L 21/28 (2006.01)
H01L 21/311 (2006.01)

(52) U.S. Cl.
CPC .. *H01L 21/28273* (2013.01); *H01L 21/28282* (2013.01); *H01L 21/31111* (2013.01); *H01L 27/11519* (2013.01); *H01L 27/11556* (2013.01); *H01L 27/11565* (2013.01); *H01L 27/11578* (2013.01); *H01L 29/04* (2013.01); *H01L 29/16* (2013.01); *H01L 29/7883* (2013.01)

(56) References Cited

U.S. PATENT DOCUMENTS

| | | | |
|---|---|---|---|
| 5,915,167 | A | 6/1999 | Leedy |
| 7,177,191 | B2 | 2/2007 | Fasoli et al. |
| 7,221,588 | B2 | 5/2007 | Fasoli et al. |
| 7,233,522 | B2 | 6/2007 | Chen et al. |
| 7,378,353 | B2 | 5/2008 | Lee et al. |
| 7,514,321 | B2 | 4/2009 | Mokhlesi et al. |
| 7,575,973 | B2 | 8/2009 | Mokhlesi et al. |
| 7,608,195 | B2 | 10/2009 | Wilson |
| 7,648,872 | B2 | 1/2010 | Benson |
| 7,745,265 | B2 | 6/2010 | Mokhlesi et al. |
| 7,745,312 | B2 | 6/2010 | Herner et al. |
| 7,808,038 | B2 | 10/2010 | Mokhlesi et al. |
| 7,848,145 | B2 | 12/2010 | Mokhlesi et al. |
| 7,851,851 | B2 | 12/2010 | Mokhlesi et al. |
| 8,008,710 | B2 | 8/2011 | Fukuzumi |
| 8,053,829 | B2 | 11/2011 | Kang et al. |
| 8,093,725 | B2 | 1/2012 | Wilson |
| 8,187,936 | B2 | 5/2012 | Alsmeier et al. |
| 8,193,054 | B2 | 6/2012 | Alsmeier |
| 8,198,672 | B2 | 6/2012 | Alsmeier |
| 8,283,228 | B2 | 10/2012 | Alsmeier |
| 8,349,681 | B2 | 1/2013 | Alsmeier et al. |
| 8,415,742 | B2 | 4/2013 | Kim et al. |
| 8,987,087 | B2 | 3/2015 | Chien et al. |
| 8,987,089 | B1 | 3/2015 | Pachamuthu et al. |
| 9,023,719 | B2 | 5/2015 | Pachamuthu et al. |
| 9,136,130 | B1 | 9/2015 | Wada et al. |
| 2006/0102586 | A1 | 5/2006 | Lee et al. |
| 2007/0210338 | A1 | 9/2007 | Orlowski |
| 2007/0252201 | A1 | 11/2007 | Kito et al. |
| 2010/0044778 | A1 | 2/2010 | Seol |
| 2010/0112769 | A1 | 5/2010 | Son et al. |
| 2010/0120214 | A1 | 5/2010 | Park et al. |
| 2010/0155810 | A1 | 6/2010 | Kim et al. |
| 2010/0155818 | A1 | 6/2010 | Cho |
| 2010/0181610 | A1 | 7/2010 | Kim et al. |
| 2010/0207195 | A1 | 8/2010 | Fukuzumi et al. |
| 2010/0320528 | A1 | 12/2010 | Jeong et al. |
| 2011/0076819 | A1 | 3/2011 | Kim et al. |
| 2011/0133606 | A1 | 6/2011 | Yoshida et al. |
| 2011/0266606 | A1 | 11/2011 | Park et al. |
| 2012/0001247 | A1 | 1/2012 | Alsmeier |
| 2012/0001249 | A1 | 1/2012 | Alsmeier |
| 2012/0256247 | A1 | 10/2012 | Alsmeier |
| 2013/0122712 | A1 | 5/2013 | Kim et al. |
| 2013/0224960 | A1 | 8/2013 | Payyapilly et al. |
| 2013/0248974 | A1 | 9/2013 | Alsmeier et al. |
| 2013/0264631 | A1 | 10/2013 | Alsmeier et al. |
| 2013/0313627 | A1 | 11/2013 | Lee et al. |
| 2014/0008714 | A1 | 1/2014 | Makala et al. |
| 2014/0225181 | A1 | 8/2014 | Makala et al. |
| 2014/0264533 | A1 | 9/2014 | Simsek-Ege et al. |
| 2014/0264542 | A1 | 9/2014 | Simsek-Ege et al. |
| 2014/0284697 | A1 | 9/2014 | Wang et al. |
| 2015/0008505 | A1 | 1/2015 | Chien et al. |
| 2015/0076584 | A1 | 3/2015 | Pachamuthu et al. |
| 2015/0076585 | A1 | 3/2015 | Pachamuthu et al. |
| 2015/0079742 | A1 | 3/2015 | Pachamuthu et al. |
| 2015/0179660 | A1 | 6/2015 | Yada et al. |

OTHER PUBLICATIONS

Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.

Maeda et al., "Multi-Stacked 1G Cell/Layer Pipe-Shaped BiCS Flash Memory," 2009 Symposium on VLSI Technology Digest of Technical Papers, pp. 22-23.

Tanaka et al., "Bit-Cost Scalable Technology for Low-Cost and Ultrahigh-Density Flash Memory," Toshiba Review, vol. 63, No. 2, 2008, pp. 28-31.

Masahide Kimura, "3D Cells Make Terabit NAND Flash Possible," Nikkei Electronics Asia, Sep. 17, 2009, 6pgs.

International Search Report & Written Opinion, PCT/US2011/042566, Jan. 17, 2012.

Invitation to Pay Additional Fees & Partial International Search Report, PCT/US2011/042566, Sep. 28, 2011.

Jang et al., "Memory Properties of Nickel Silicide Nanocrystal Layer for Possible Application to Nonvolatile Memory Devices," IEEE Transactions on Electron Devices, vol. 56, No. 12, Dec. 2009.

Chen et al., "Reliability Characteristics of NiSi Nanocrystals Embedded in Oxide and Nitride Layers for Nonvolatile Memory Application," Applied Physics Letters 92, 152114 (2008).

J. Ooshita, Toshiba Announces 32Gb 3D-Stacked Multi-Level NAND Flash, 3 pages, http://techon.nikkeibp.co.jp/english/NEWS_EN/20090619/171977/ Nikkei Microdevices, Tech-On, Jun. 19, 2009.

Wang et al., "Low Temperature Silicon Selective Epitaxial Growth (SEG) and Phosphorous Doping in a Reduced-Pressure Pancake Reactor", ECE Technical Reports, Paper 299 (Apr. 1, 1992).

Whang et al., "Novel 3-Dimensional Dual Control-Gate with Surrounding Floating-Gate (DC-SF) NAND Flash Cell for 1Tb File Storage Application", IEDM-2010 Proceedings, Dec. 6-8, 2010, pp. 668-671.

Y.S. Kim et al., "Direct Copper Electroless Deposition on a Tungsten Barrier Layer for Ultralarge Scale Integration," Journal of the Electrochemical Society, vol. 152 (2) 2005.

Au, Y. et al., "Filling Narrow Trenches by Iodine-Catalyzed CVD of Copper and Manganese on Manganese Nitride Barrier/Adhesion Layers," Journal of the Electrochemical Society, vol. 158 (5) 2011.

K. R. Williams et al., "Etch Rates for Micromachining Processing," Journal of Microelectromechanical Systems, vol. 5, No. 4, Dec. 1996.

K. R. Williams et al., "Etch Rates for Micromachining Processing Part II," Journal of the Microelectromechanical Systems, vol. 12, No. 6, Dec. 2003.

M. Claes et al., "Selective Wet Etching of Hf-based Layers," Abstracts, 204th Meeting of the Electrochemical Society, 2003.

Endoh, et al., "Novel Ultra High Density Memory with a Stacked-Surrounding Gate Transistor (S-SGT) Structured Cell," IEDM Proc. (2001) 33-36.

Rem et al., "Incubation Time Measurements in Thin-Film Deposition," J. Electrochem. Soc., vol. 144, No. 6, 1997, pp. 2101-2106.

U.S. Appl. No. 14/319,283, filed Jun. 30, 2014, SanDisk Technologies Inc.

(56) References Cited

OTHER PUBLICATIONS

U.S. Appl. No. 14/519,733, filed Oct. 21, 2014, SanDisk Technologies Inc.
U.S. Appl. No. 14/523,287, filed Oct. 24, 2014, SanDisk Technologies Inc.
U.S. Appl. No. 14/530,220, filed Oct. 31, 2014, SanDisk Technologies Inc.
U.S. Appl. No. 14/539,307, filed Nov. 12, 2014, SanDisk Technologies Inc.
U.S. Appl. No. 14/539,372, filed Nov. 12, 2014, SanDisk Technologies Inc.
U.S. Appl. No. 14/560,308, filed Dec. 4, 2014, SanDisk Technologies Inc.
U.S. Appl. No. 14/560,351, filed Dec. 4, 2014, SanDisk Technologies Inc.
U.S. Appl. No. 14/560,444, filed Dec. 4, 2014, SanDisk Technologies Inc.
U.S. Appl. No. 14/571,824, filed Dec. 16, 2014, SanDisk Technologies Inc.
U.S. Appl. No. 14/600,226, filed Jan. 20, 2015, SanDisk Technologies Inc.
U.S. Appl. No. 14/620,674, filed Feb. 12, 2015, SanDisk Technologies Inc.
U.S. Appl. No. 14/751,922, filed Jun. 26, 2015, SanDisk Technologies Inc.

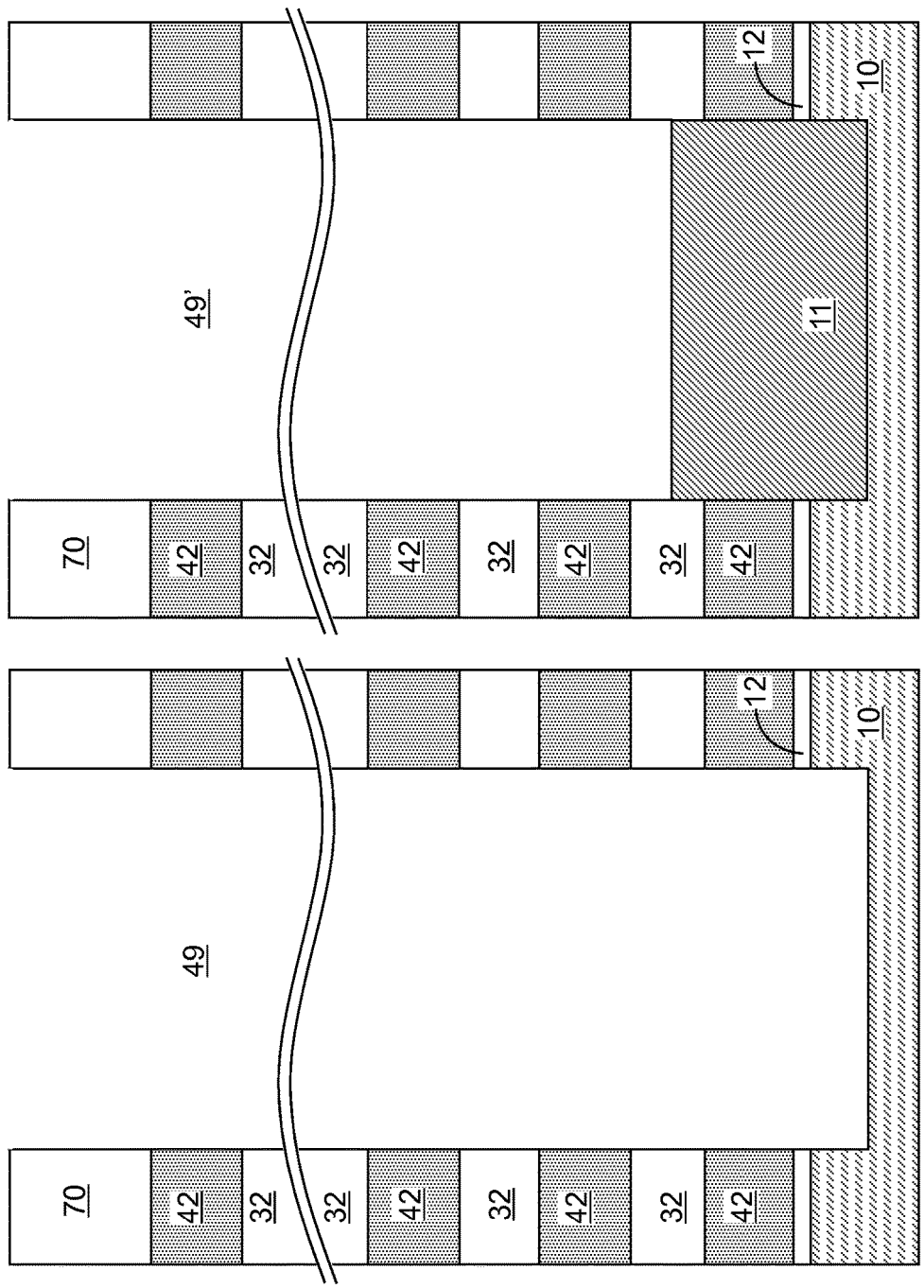

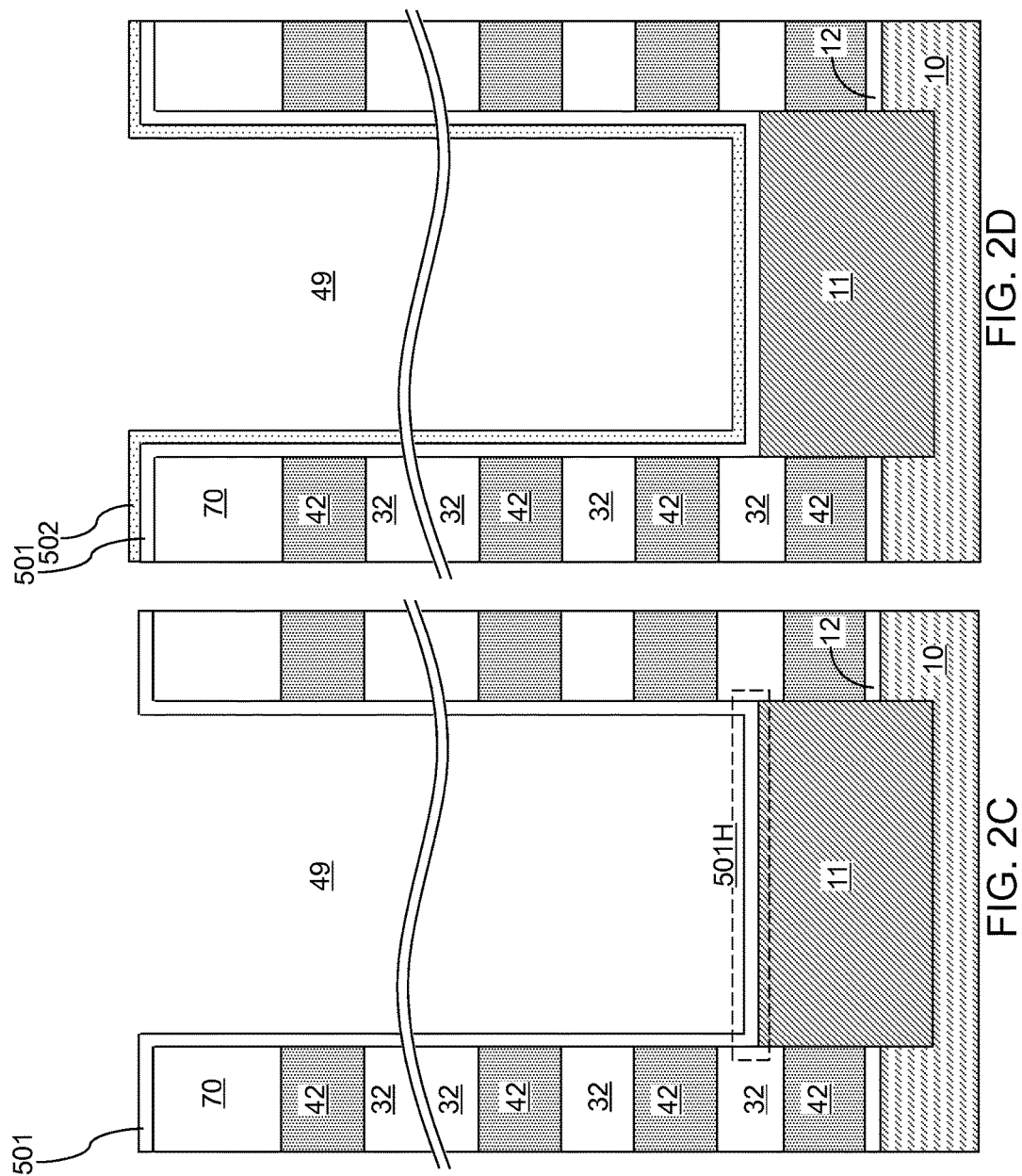

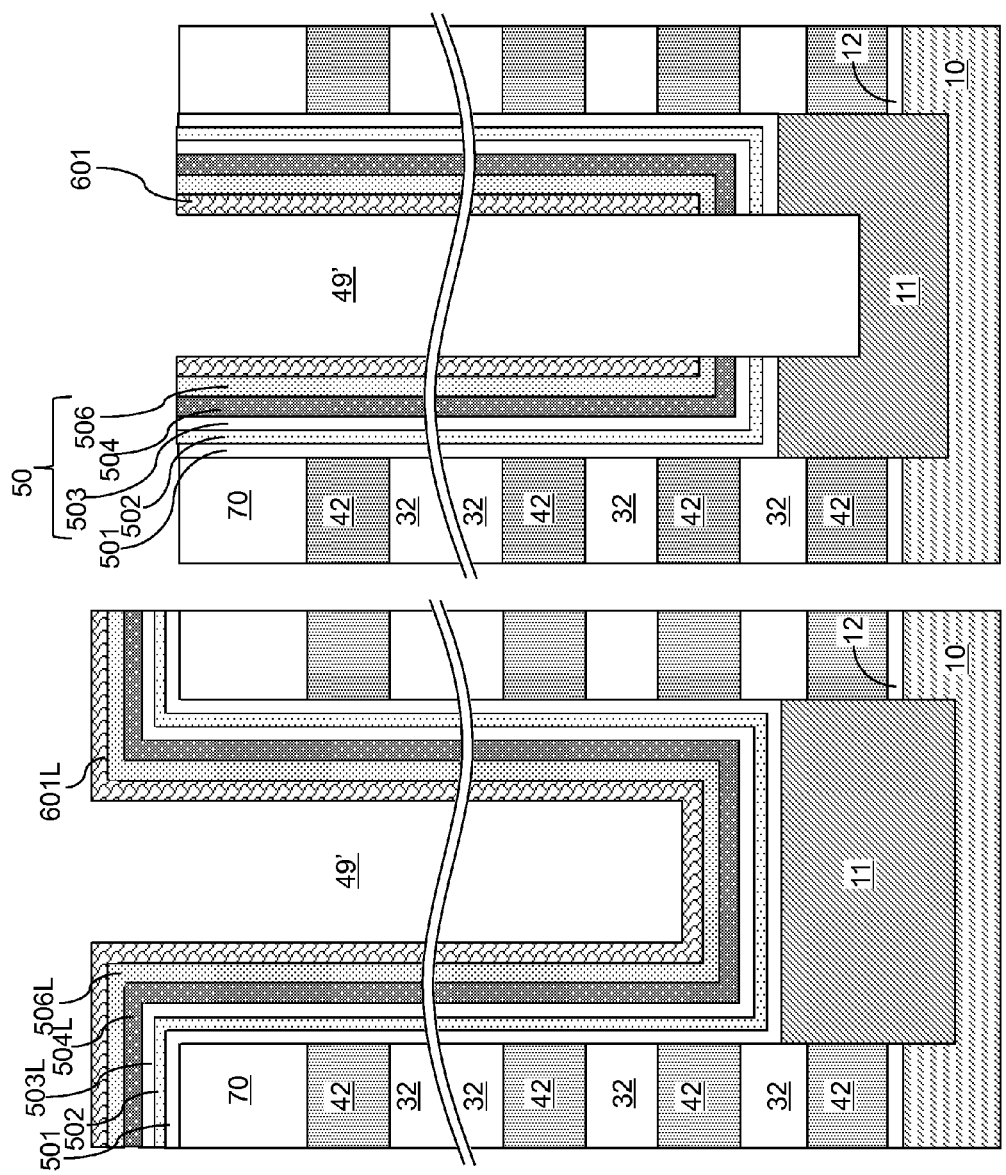

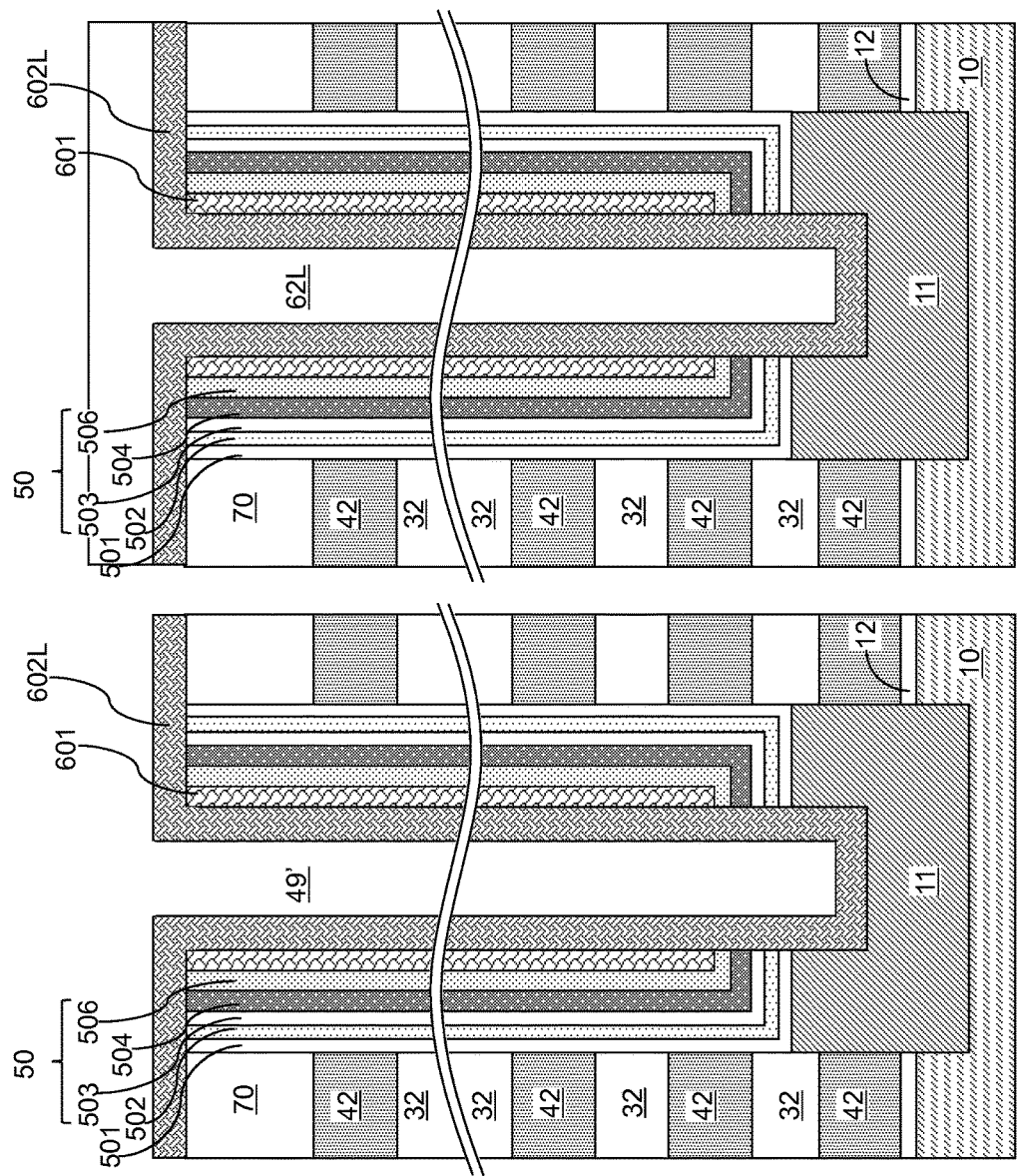

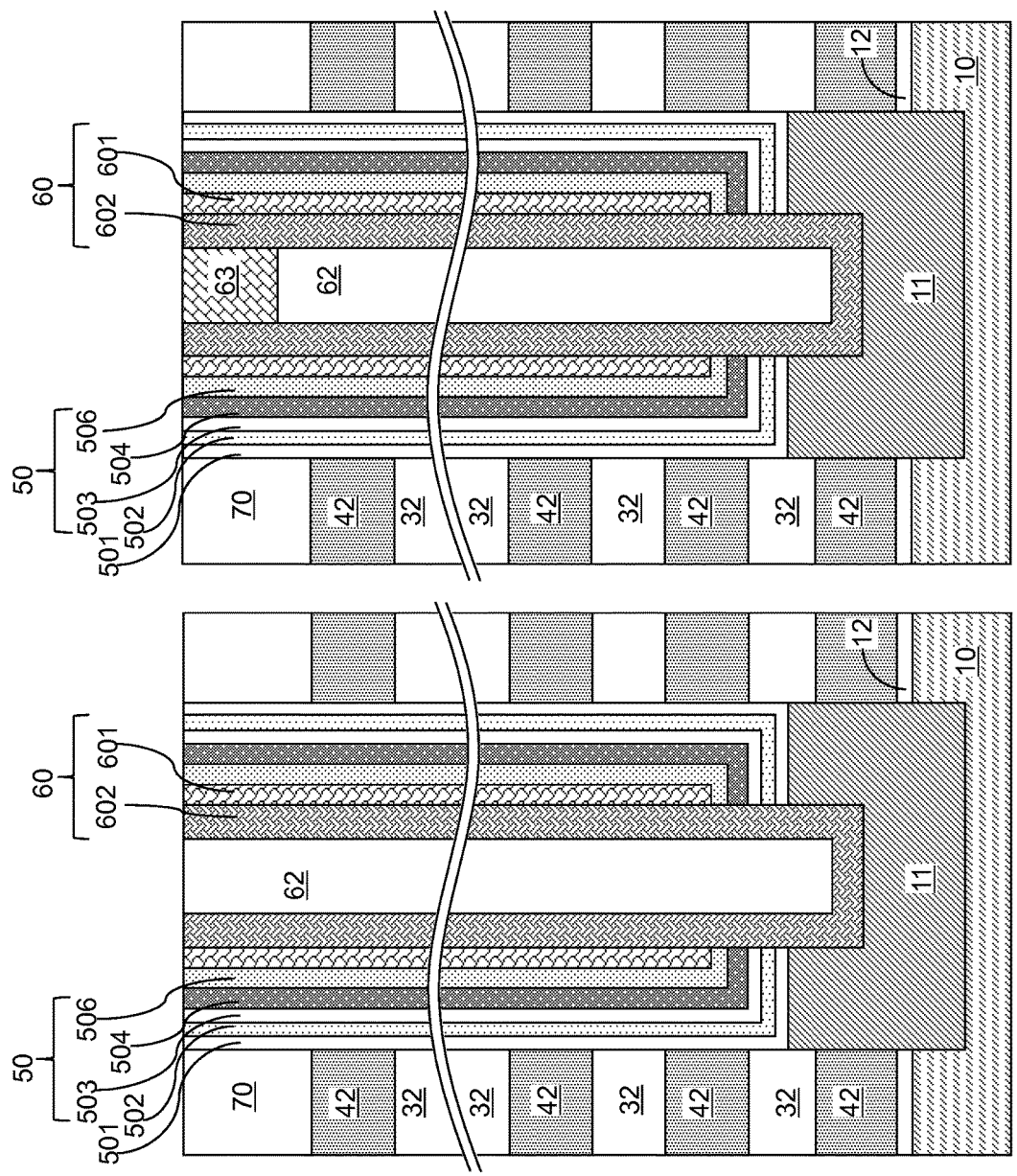

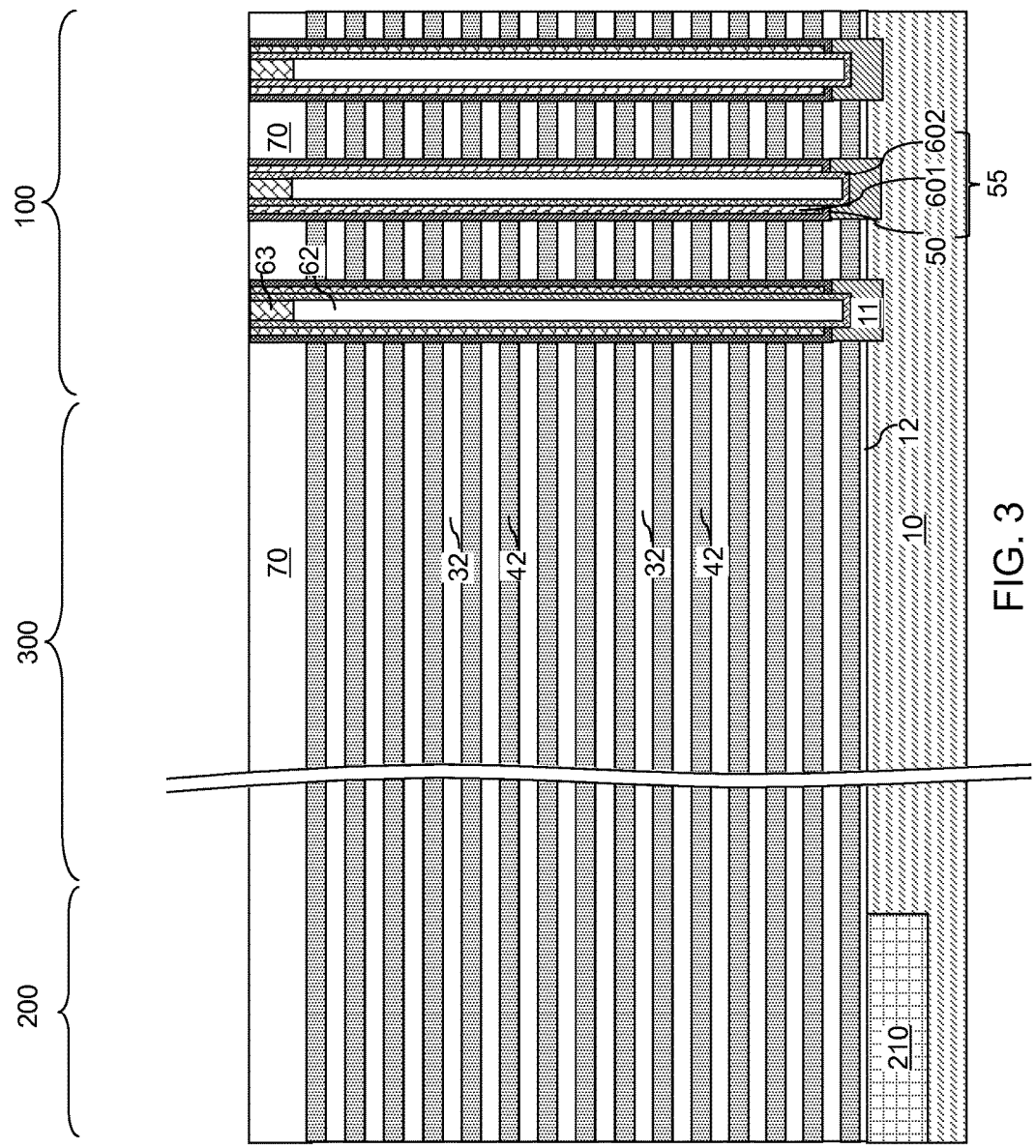

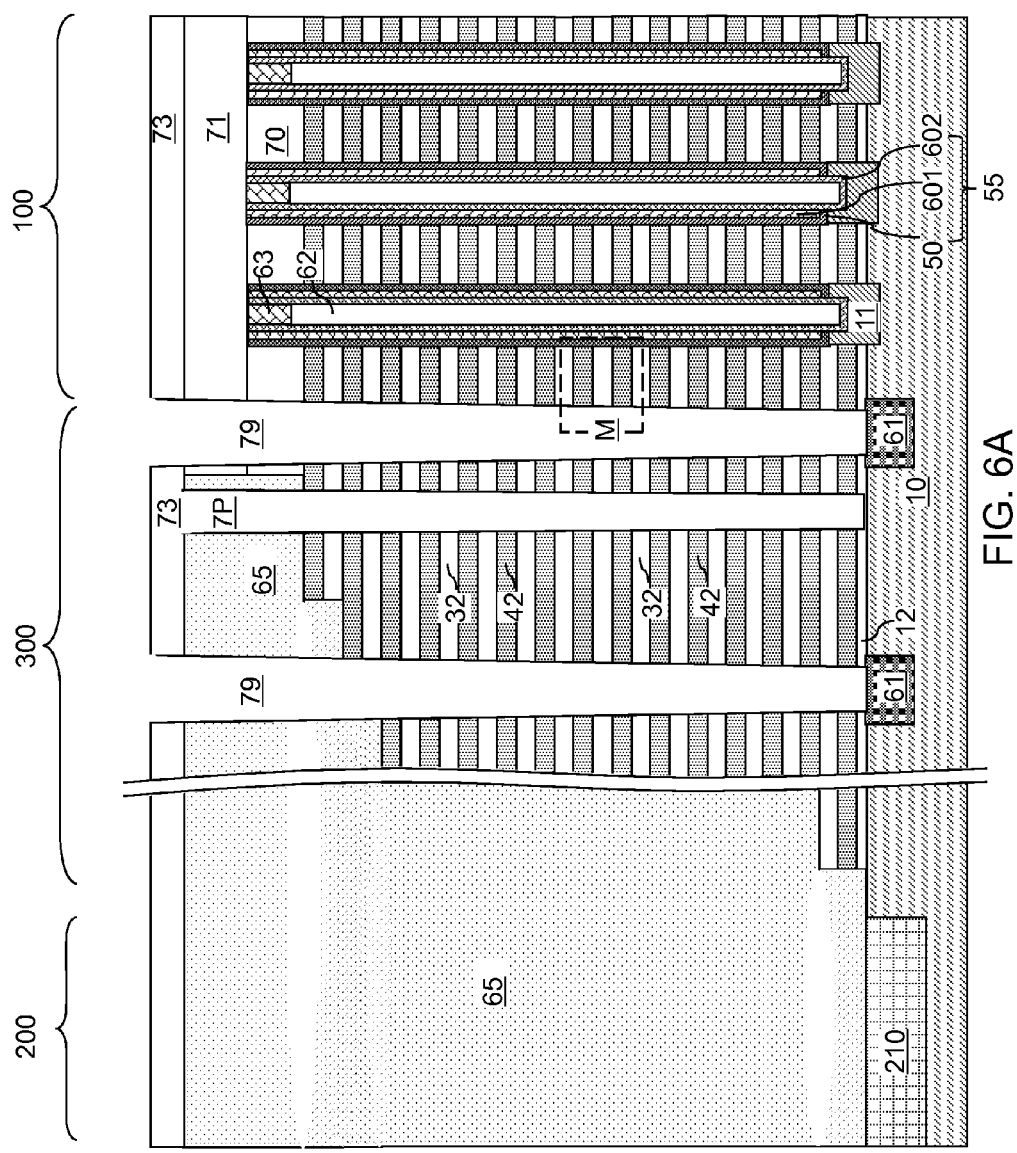

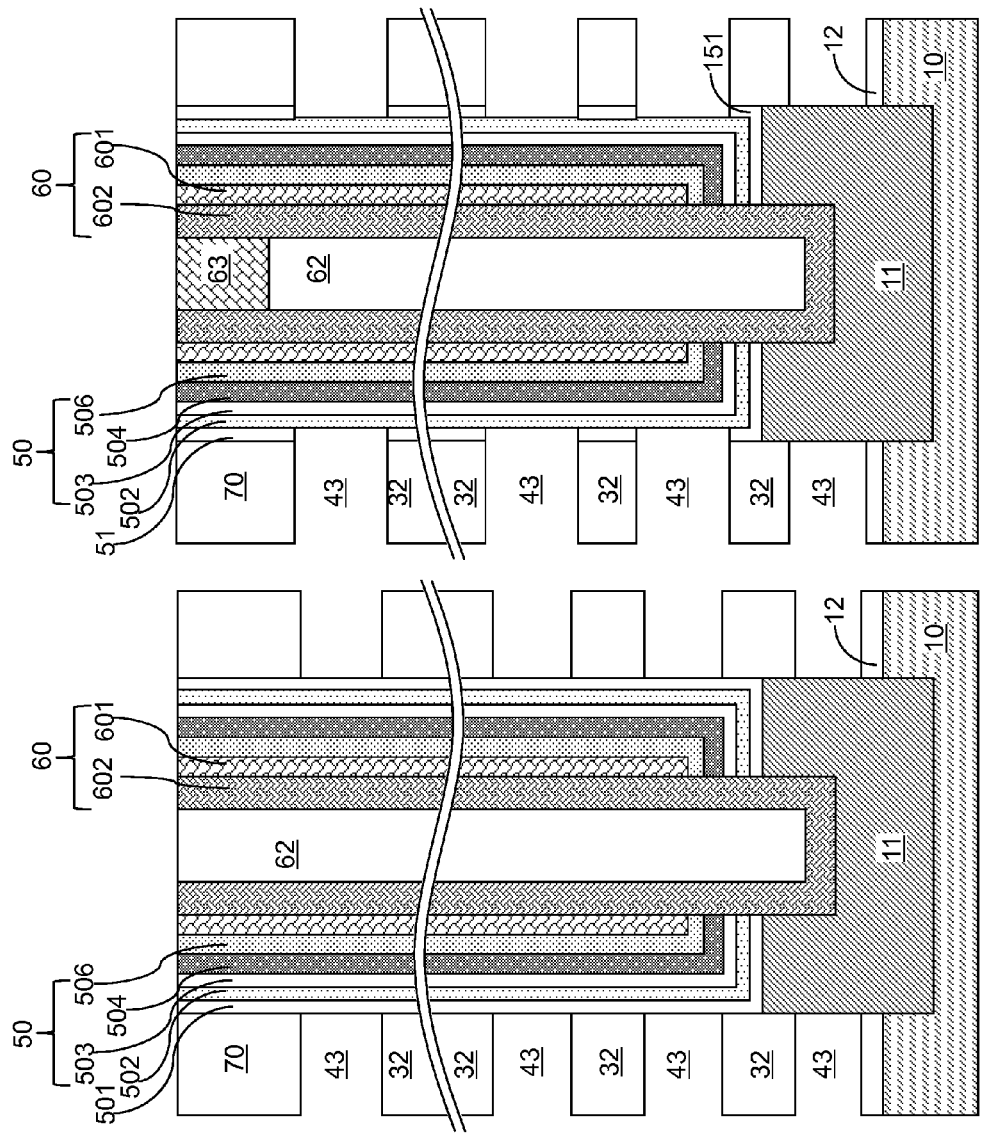

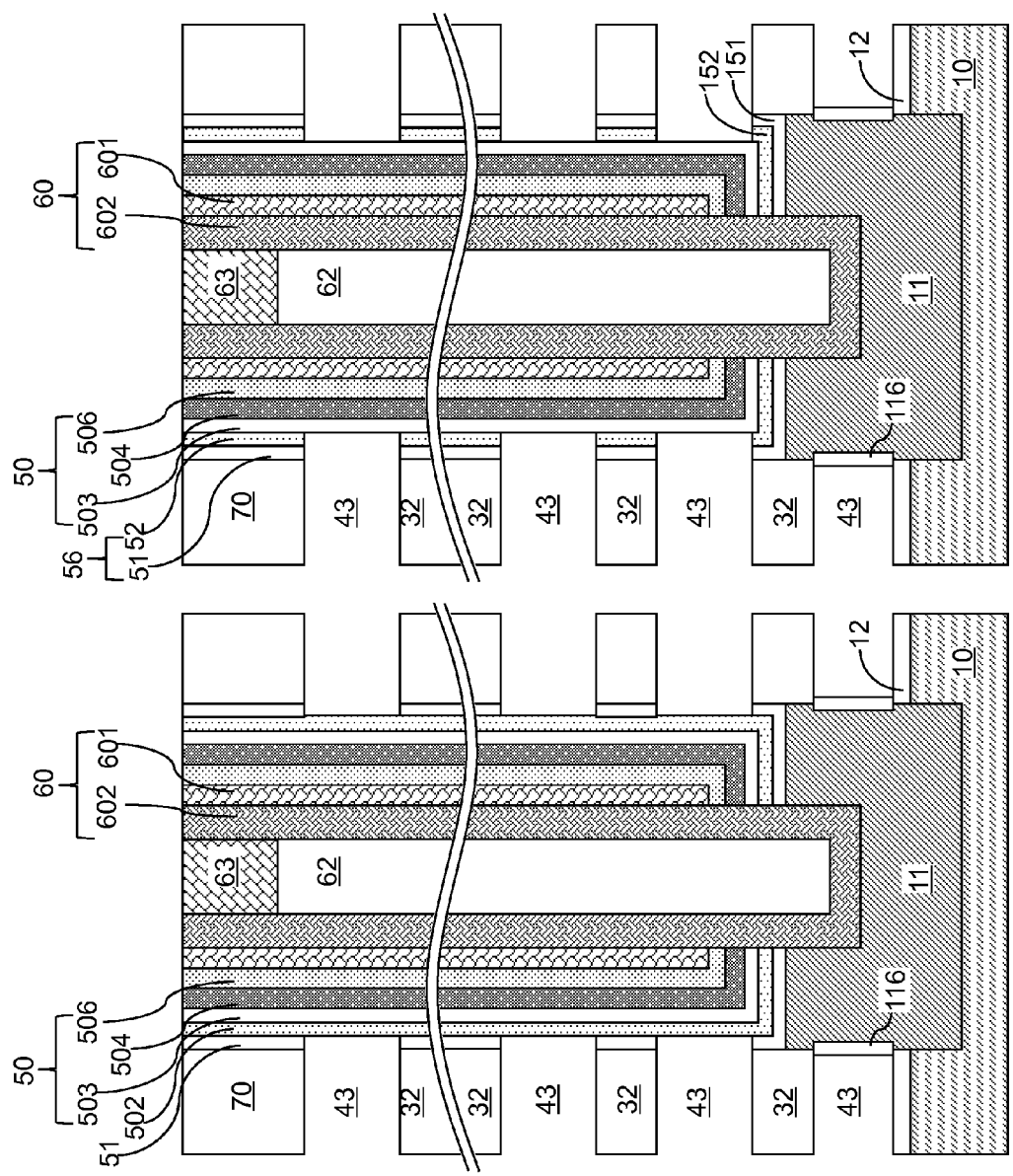

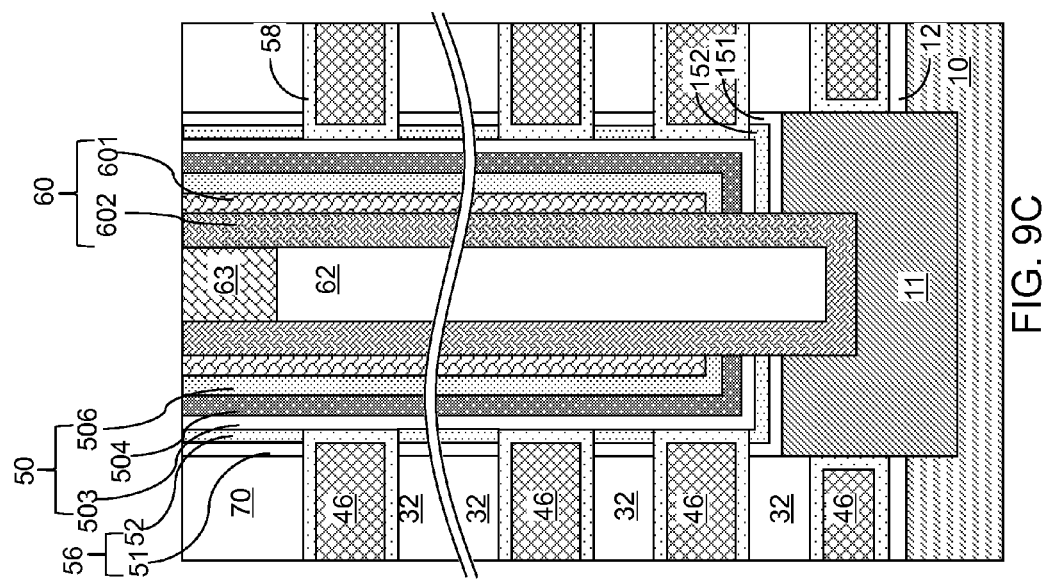

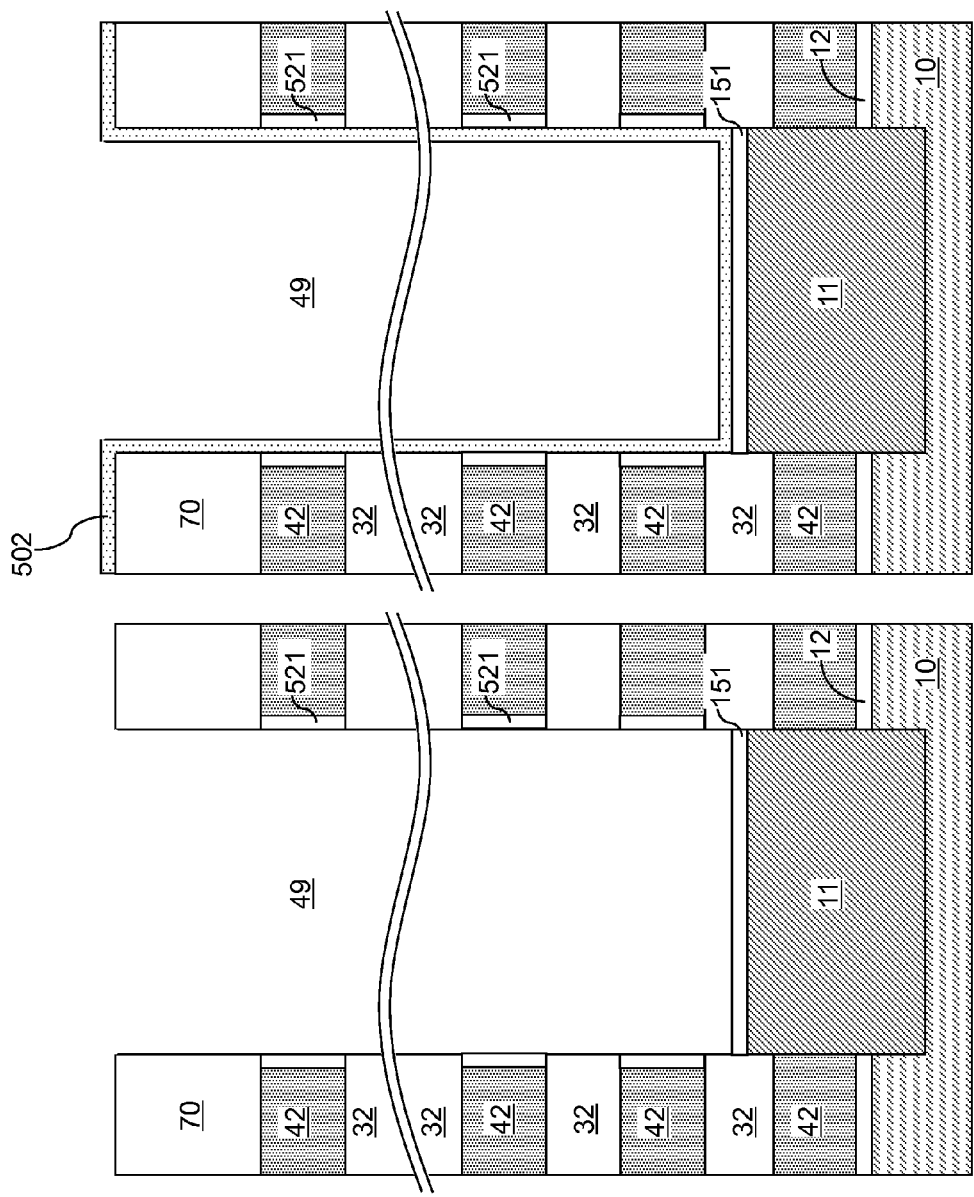

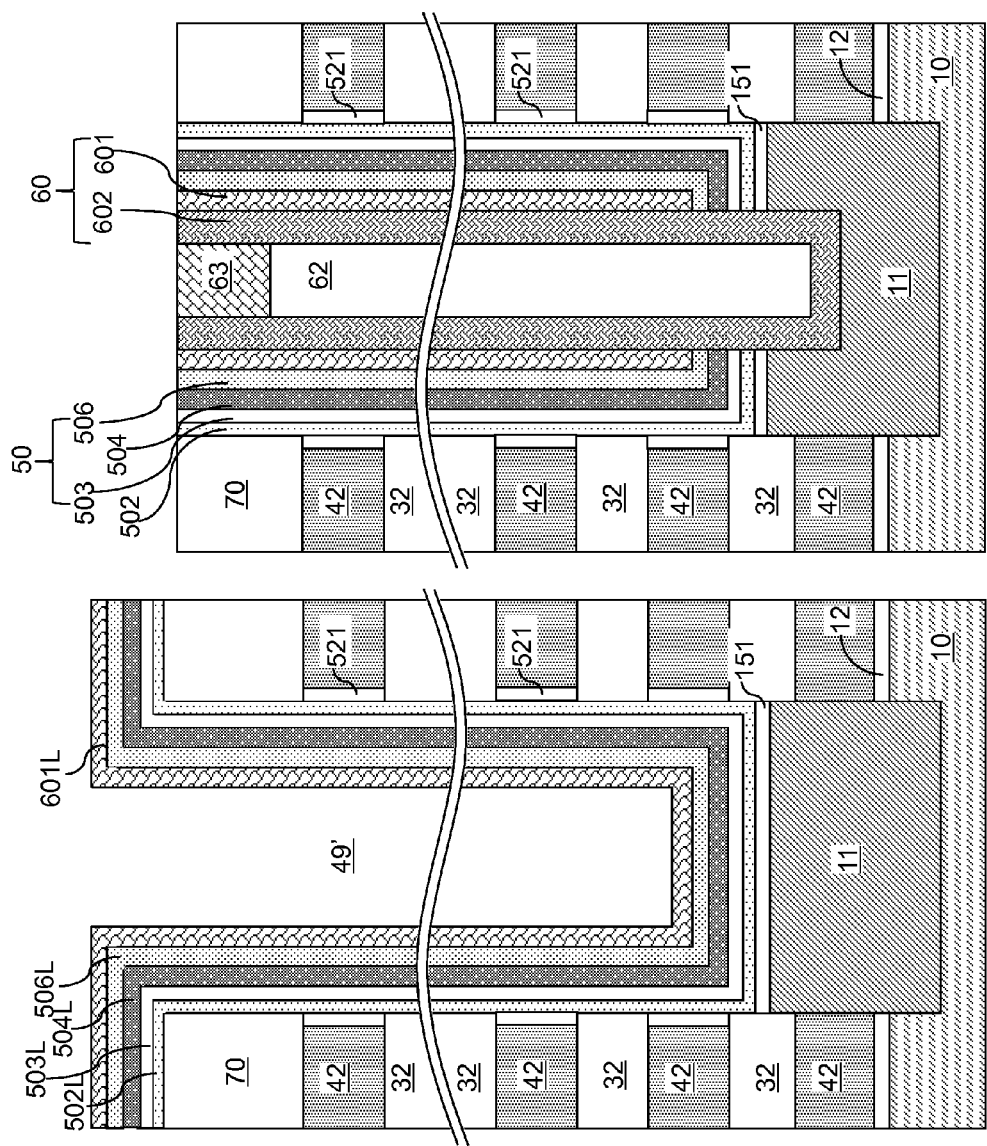

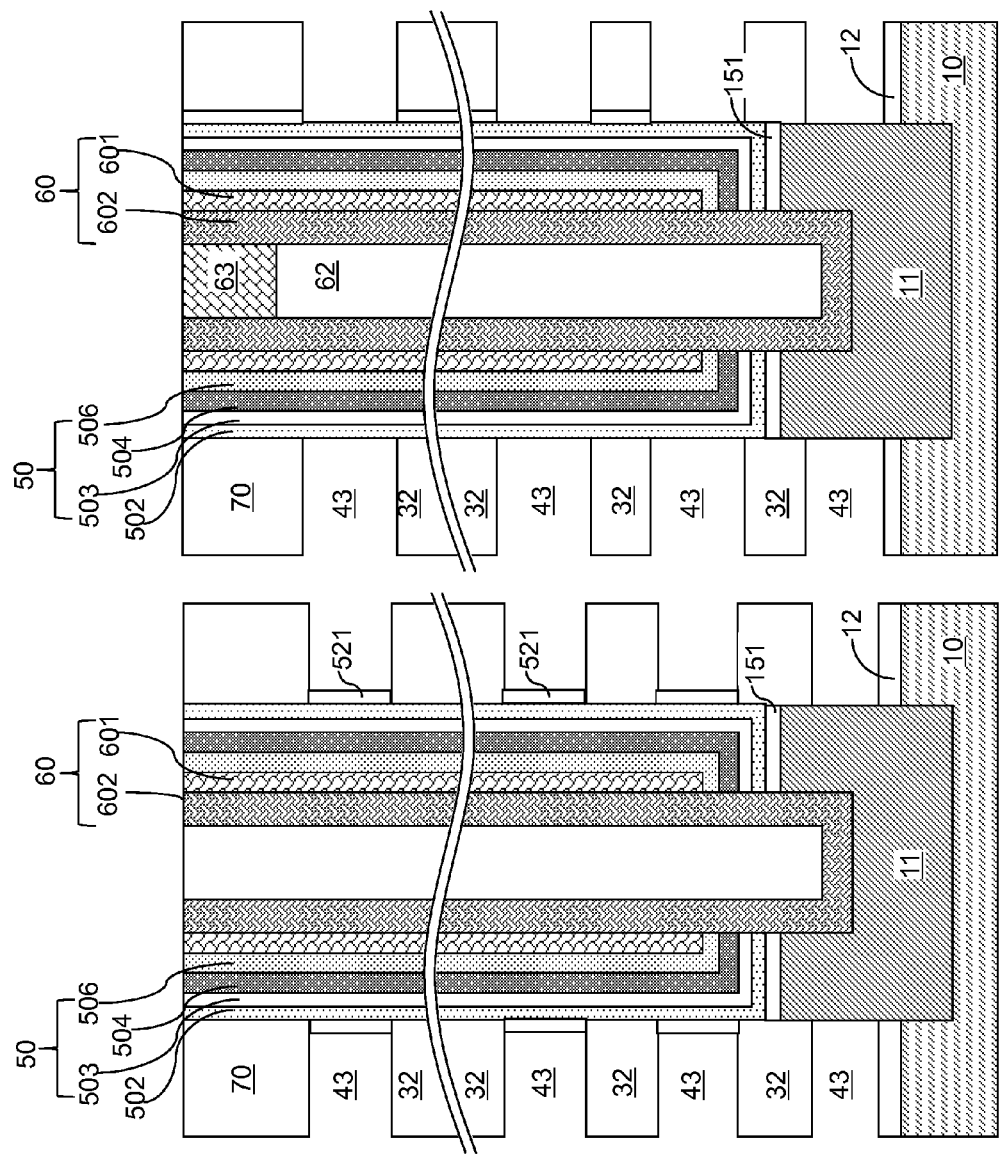

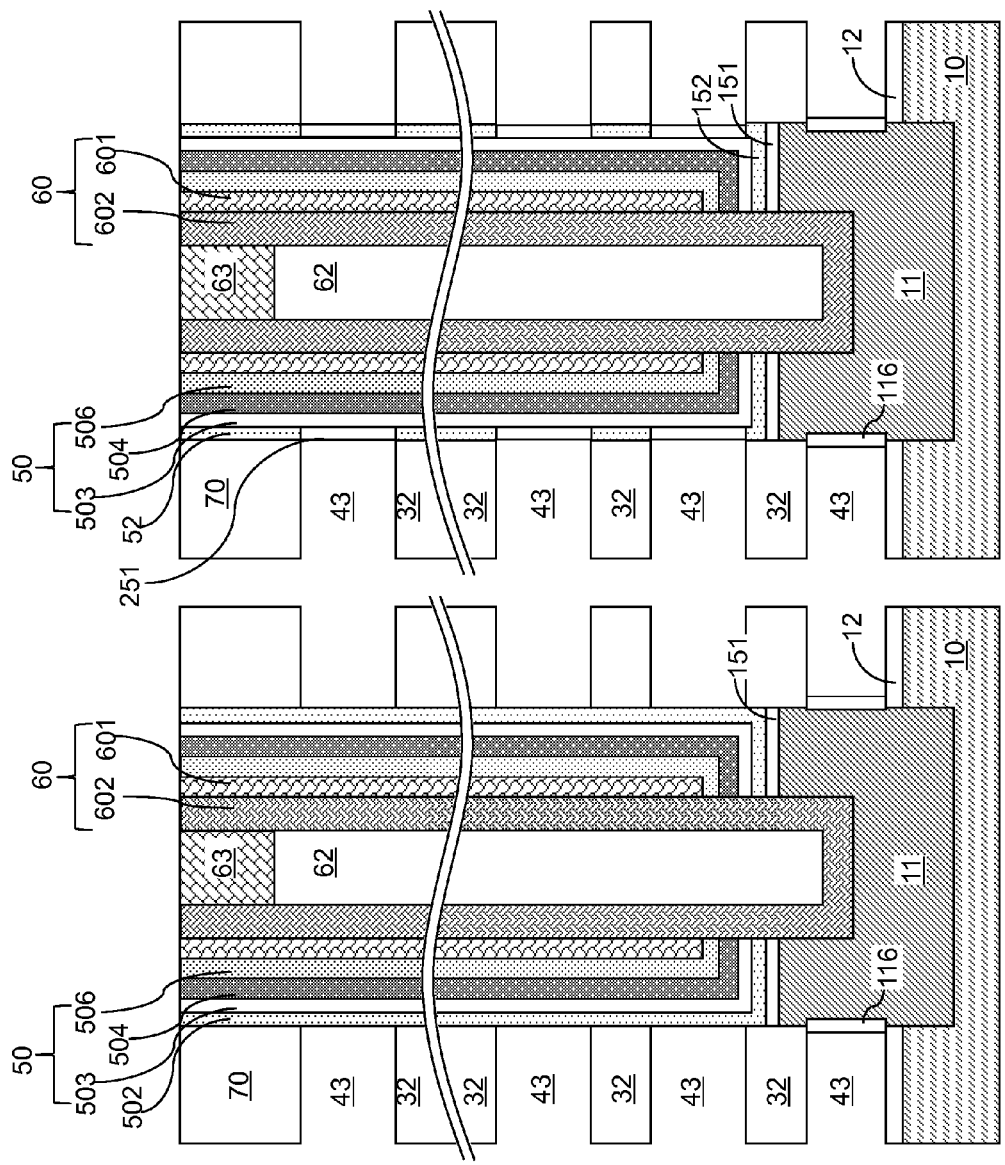

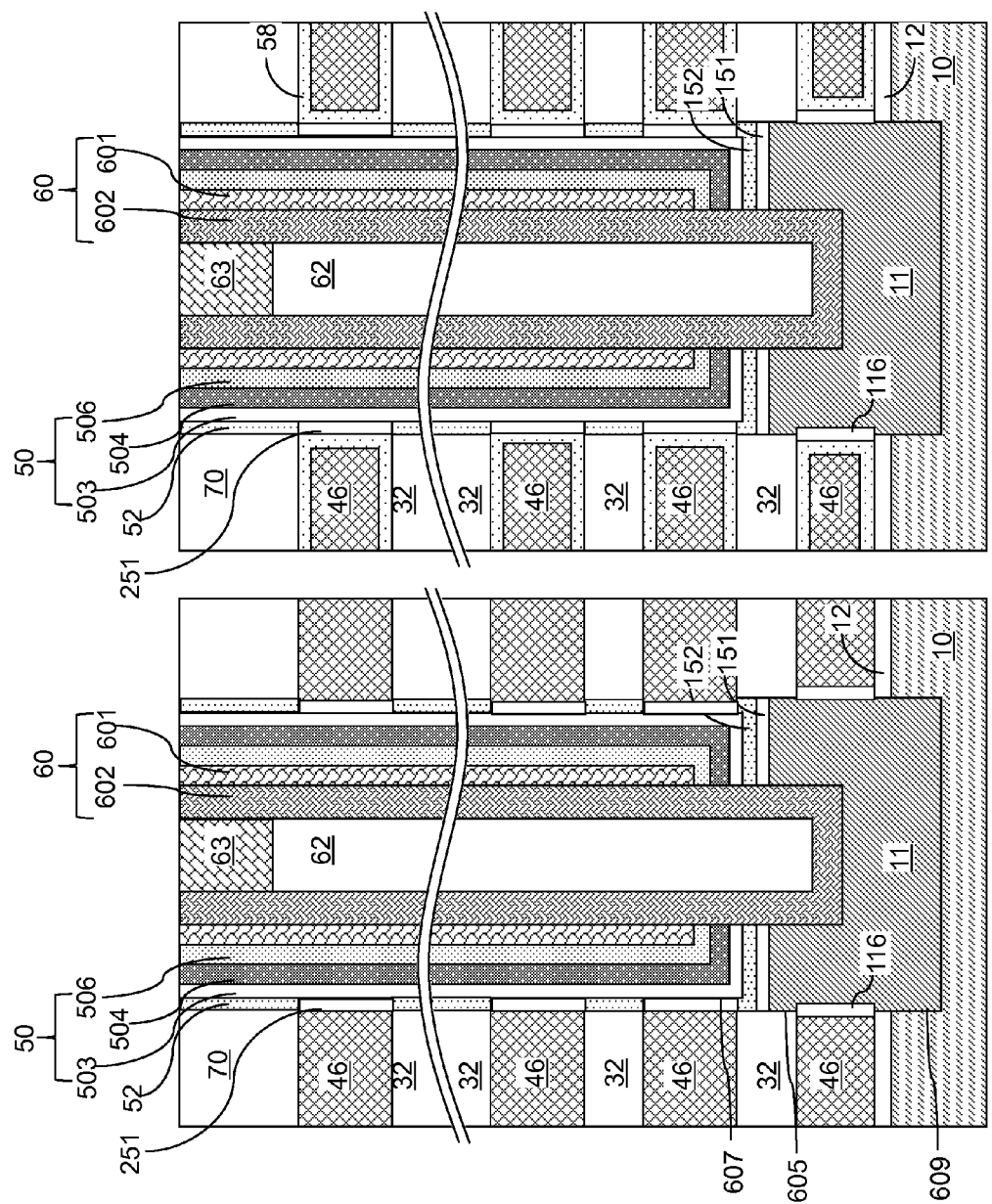

BLOCKING OXIDE IN MEMORY OPENING INTEGRATION SCHEME FOR THREE-DIMENSIONAL MEMORY STRUCTURE

FIELD

The present disclosure relates generally to the field of semiconductor devices and specifically to three-dimensional memory structures, such as vertical NAND strings and other three-dimensional devices, and methods of making thereof.

BACKGROUND

Three-dimensional vertical NAND strings having one bit per cell are disclosed in an article by T. Endoh, et. al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device is provided, which comprises an alternating stack of insulating layers and electrically conductive layers and located over a substrate; a memory stack structure extending through the alternating stack and comprising, from outside to inside, a blocking dielectric, memory elements, a tunneling dielectric, and a semiconductor channel; and annular silicon nitride spacers located at each level of the insulating layers, vertically spaced from one another, and contacting an outer sidewall of the blocking dielectric.

According to another aspect of the present disclosure, a method of manufacturing a three-dimensional memory device is provided. An alternating stack comprising insulating layers and sacrificial material layers is formed over a substrate. A memory opening extending through the alternating stack is formed. At least one silicon oxide portion is formed at a periphery of the memory opening. All surfaces of the memory opening are silicon oxide surfaces after formation of the at least one silicon oxide portion. A silicon nitride layer is formed within the memory opening. A memory stack structure is formed within a remaining portion of the memory opening. Backside recesses are formed around the memory stack structures by removing the sacrificial material layers selective to the insulating layers and at least one silicon oxide portion. Physically exposed portions of the at least one silicon oxide portion are removed selective to the silicon nitride layer from the backside recesses. Physically exposed portions of the silicon nitride layer are etched away or converted to silicon oxide selective to the memory stack structure. Electrically conductive layers are formed in the backside recesses.

BRIEF DESCRIPTION OF THE DRAWINGS

FIGS. 2A-2J are sequential vertical cross-sectional views of a memory opening within the first exemplary structure during various processing steps employed to form a memory stack structure according to the first embodiment of the present disclosure.

FIG. 3 is a vertical cross-sectional view of the first exemplary structure after formation of memory stack structures according to the first embodiment of the present disclosure.

FIG. 6A is a vertical cross-sectional view of the first exemplary structure after formation of backside trenches according to the first embodiment of the present disclosure.

FIGS. 7A-7D are vertical cross-sectional views of a memory stack structure in the first exemplary structure during formation of backside recesses according to the first exemplary structure of the present disclosure.

FIG. 9A-9C are vertical cross-sectional views of various configurations of the first exemplary structure around a memory stack structure after formation of the electrically conductive layers according to the first embodiment of the present disclosure.

FIGS. 12A-12D are sequential vertical cross-sectional views of a memory opening within a second exemplary structure during various processing steps employed to form a memory stack structure according to a second embodiment of the present disclosure.

FIGS. 13A-13D are vertical cross-sectional views of a memory stack structure in the second exemplary structure during formation of backside recesses according to the second exemplary structure of the present disclosure.

FIGS. 14A-14C are vertical cross-sectional views of various configurations of the second exemplary structure around a memory stack structure after formation of the electrically conductive layers according to the second embodiment of the present disclosure.

DETAILED DESCRIPTION

Figure 1:
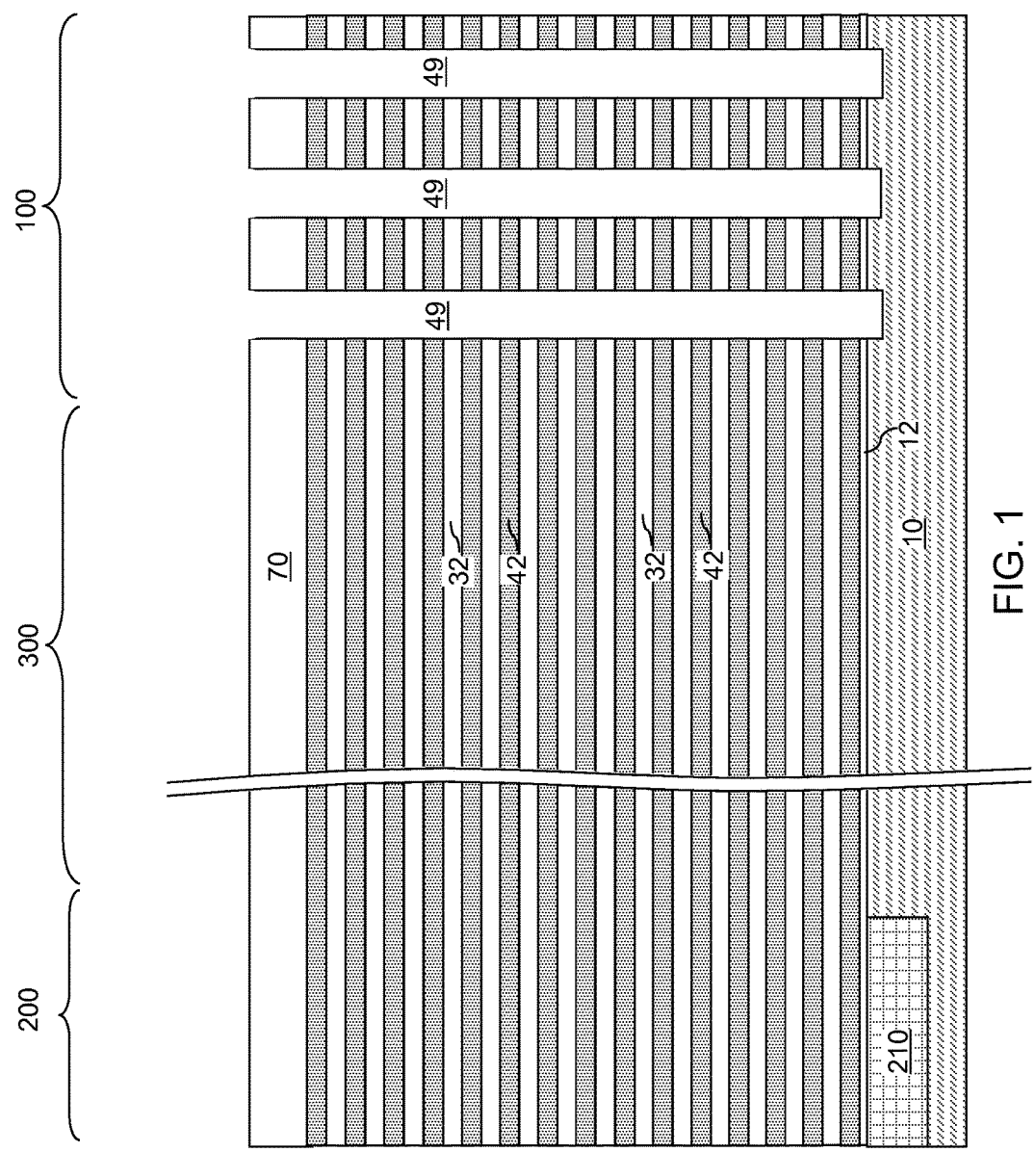
FIG. 1 is a vertical cross-sectional view of a first exemplary structure after formation of an alternating stack of insulating layers and sacrificial material layers and memory openings extending through the alternating stack according to a first embodiment of the present disclosure.

As discussed above, the present disclosure is directed to three-dimensional memory structures, such as vertical NAND strings and other three-dimensional devices, and methods of making thereof, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a substantially uniform thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

As used herein, a "field effect transistor" refers to any semiconductor device having a semiconductor channel through which electrical current flows with a current density modulated by an external electrical field. As used herein, an "active region" refers to a source region of a field effect transistor or a drain region of a field effect transistor. A "top active region" refers to an active region of a field effect transistor that is located above another active region of the field effect transistor. A "bottom active region" refers to an active region of a field effect transistor that is located below another active region of the field effect transistor. A monolithic three-dimensional memory array is a memory array in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Referring to FIG. 1, an exemplary structure according to the first exemplary structure of the present disclosure is illustrated, which can be employed, for example, to fabricate a device structure containing vertical NAND memory devices. The first exemplary structure includes a substrate, which can be a semiconductor substrate (e.g., a semiconductor substrate, such as a single crystalline silicon wafer). The substrate can include a semiconductor substrate layer 10. The semiconductor substrate layer 10 is a semiconductor material layer, and can include at least one elemental semiconductor material (e.g., silicon, such as single crystalline silicon), at least one III-V compound semiconductor material, at least one II-VI compound semiconductor material, at least one organic semiconductor material, or other semiconductor materials known in the art.

As used herein, a "semiconductor material" refers to a material having electrical conductivity in the range from $1.0 \times 10^{-6}$ S/cm to $1.0 \times 10^{5}$ S/cm, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulating material" or a "dielectric material" refers to a material having electrical conductivity less than $1.0 \times 10^{-6}$ S/cm. All measurements for electrical conductivities are made at the standard condition. The semiconductor substrate layer 10 can include at least one doped well (not expressly shown) having a substantially uniform dopant concentration therein.

The first exemplary structure can have multiple regions for building different types of devices. Such areas can include, for example, a device region 100, a contact region 300, and a peripheral device region 200. In one embodiment, the semiconductor substrate layer 10 can include at least one a doped well in the device region 100. As used herein, a "doped well" refers to a portion of a semiconductor material having a doping of a same conductivity type (which can be p-type or n-type) and a substantially same level of dopant concentration throughout. The doped well can be the same as the semiconductor substrate layer 10 or can be a portion of the semiconductor substrate layer 10. The conductivity type of the doped well is herein referred to as a first conductivity type, which can be p-type or n-type. The dopant concentration level of the doped well is herein referred to as a first dopant concentration level. In one embodiment, the first dopant concentration level can be in a range from $1.0 \times 10^{15}/cm^{3}$ to $1.0 \times 10^{18}/cm^{3}$, although lesser and greater dopant concentration levels can also be employed. As used herein, a dopant concentration level refers to average dopant concentration for a given region.

Peripheral devices 210 can be formed in, or on, a portion of the semiconductor substrate layer 10 located within the peripheral device region 200. The peripheral devices can include various devices employed to operate the memory devices to be formed in the device region 100, and can include, for example, driver circuits for the various components of the memory devices. The peripheral devices 210 can include, for example, field effect transistors and/or passive components such as resistors, capacitors, inductors, diodes, etc.

Optionally, a gate dielectric layer 12 can be formed above the semiconductor substrate layer 10. The gate dielectric layer 12 can be employed as the gate dielectric for a first source select gate electrode. The gate dielectric layer 12 can include, for example, silicon oxide and/or a dielectric metal oxide (such as $HfO_2$, $ZrO_2$, $LaO_2$, etc.). The thickness of the gate dielectric layer 12 can be in a range from 3 nm to 30 nm, although lesser and greater thicknesses can also be employed.

An alternating stack of first material layers (which can be insulating layers 32) and second material layers (which are referred to spacer material layers) is formed over the top surface of the substrate, which can be, for example, on the top surface of the gate dielectric layer 12. As used herein, a "material layer" refers to a layer including a material throughout the entirety thereof. In one embodiment, the alternating stack may include the insulating layers 132 and spacer material layers that are located between each vertically neighboring pair of insulating layers 132. As used herein, a "spacer material layer" refers to a material layer that is located between two other material layers, i.e., between an overlying material layer and an underlying material layer. The spacer material layers can be formed as electrically conductive layers, or can be replaced with electrically conductive layers in a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer (i.e., the spacer material layer) can be a sacrificial material layer 42. In this case, the stack can include an alternating plurality of insulating layers 32 and sacrificial material layers 42, and constitutes a prototype stack of alternating layers comprising insulating layers 32 and sacrificial material layers 42. As used herein, a "prototype" structure or an "in-process" structure refers to a transient structure that is subsequently modified in the shape or composition of at least one component therein.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In an illustrative example, the insulating layers 32 can include silicon oxide, and sacrificial material layers can include silicon nitride. As used herein, silicon nitride or a silicon nitride material, refers to a dielectric compound of at least one Group IV element and at least one non-metallic Group VI element. Silicon accounts more than 50 atomic percent of the at least one Group IV element and nitrogen accounts for more than 50 atomic percent of the non-metallic element. As such, silicon nitrides include stoichiometric $Si_3N_4$, non-stoichiometric silicon nitride, and a silicon oxynitride in which the atomic concentration of nitrogen is greater than the atomic concentration of oxygen. As used herein, silicon oxide, or a silicon oxide material, refers to a dielectric compound of at least one Group IV element and at least one non-metallic Group VI element. Silicon accounts more than 50 atomic percent of the at least one Group IV element and oxygen accounts for more than 50 atomic percent of the non-metallic element. Silicon oxides include silicon dioxide, non-stoichiometric silicon oxide, an oxide of a silicon-germanium alloy in which the atomic concentration of silicon is greater than the atomic concentration of germanium, a silicon oxynitride in which the atomic concentration of oxygen is greater than the atomic concentration of nitrogen, and doped derivatives thereof (such as phosphosilicate glass, fluorosilicate glass, borophosphosilicate glass, organosilicate glass, etc.). The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the top surface of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

A lithographic material stack (not shown) including at least a photoresist layer can be formed over the insulating cap layer 70 and the alternating stack (32, 42), and can be lithographically patterned to form openings therein. The pattern in the lithographic material stack can be transferred through the insulating cap layer 70 and through entirety of the alternating stack (32, 42) by at least one anisotropic etch that employs the patterned lithographic material stack as an etch mask. Portions of the alternating stack (32, 42) underlying the openings in the patterned lithographic material stack are etched to form first memory openings 49. In other words, the transfer of the pattern in the patterned lithographic material stack through the alternating stack (32, 42) forms the first memory openings that extend through the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. Optionally, the gate dielectric layer 12 may be used as an etch stop layer between the alternating stack (32, 42) and the substrate. The sidewalls of the first memory openings can be substantially vertical, or can be tapered. The patterned lithographic material stack can be subsequently removed, for example, by ashing.

A memory stack structure can be formed in each of the memory opening. FIGS. 2A-2H illustrate sequential vertical cross-sectional views of a memory opening during formation of an exemplary memory stack structure. Formation of the exemplary memory stack structure can be performed within each of the memory openings 49 in the first exemplary structure illustrated in FIG. 1.

Referring to FIG. 2A, a memory opening 49 is illustrated. The memory opening 49 extends through the insulating cap layer 70, the alternating stack (32, 42), and the gate dielectric layer 12, and optionally into an upper portion of the semiconductor substrate layer 10. The recess depth of the bottom surface of each memory opening 49 with respect to the top surface of the semiconductor substrate layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 2B, an epitaxial channel portion 11 can be optionally formed at the bottom of each memory opening 49 by selective epitaxy of a semiconductor material. During the selective epitaxy process, a reactant gas and an etchant gas can be simultaneously or alternatively flowed into a process chamber. Semiconductor surfaces and dielectric surfaces of the first exemplary structure provide different nucleation rates for the semiconductor material. By setting the etch rate (determined by the flow of the etchant gas) of the semiconductor material greater than the nucleation rate of the semiconductor material on the dielectric surfaces and less than the nucleation rate of the semiconductor material on the semiconductor surfaces, the semiconductor material can grow from the physically exposed semiconductor surfaces (i.e., from the physically exposed surfaces of the semiconductor substrate layer 10 at the bottom of each memory opening 49). Each portion of the deposited semiconductor material constitutes an epitaxial channel portion 11, which comprises a single crystalline semiconductor material (e.g., single crystalline silicon) in epitaxial alignment with the single crystalline semiconductor material (e.g., single crystalline silicon) of the semiconductor substrate layer 10. Each epitaxial channel portion 11 functions as a portion of a channel of a vertical field effect transistor.

Each epitaxial channel portion 11 includes a single crystalline semiconductor material that grows from a physically exposed semiconductor surface of the semiconductor substrate layer 10 from underneath the respective memory opening 49. The top surface of the epitaxial channel portion 11 can be between a pair of sacrificial material layers 42. In other words, a periphery of each epitaxial channel portion 11 can be in physical contact with a sidewall of an insulating layer 32. A cavity 49' is present over an epitaxial channel portion 11 in each memory opening 49. The volume of each memory opening 49 is reduced by the growth of the epitaxial channel portion 11.

Referring to FIG. 2C, a processing step is performed to provide silicon oxide surfaces at all physically exposed surfaces of the memory openings 49. In one embodiment, at least one silicon oxide portion can be formed at a periphery of each memory opening so that all surfaces of the memory opening are silicon oxide surfaces after formation of the at least one silicon oxide portion. In one embodiment, the at least one silicon oxide portion can be formed as a continuous silicon oxide layer 501. The silicon oxide layer 501 is an oxide layer that continuously extends across the entire top surface of the insulating cap layer 70 and into each of the memory openings 49. The silicon oxide layer 501 covers the entirety of the sidewall and the entirety of the bottom surface of each memory openings 49. Thus, all surfaces of the memory openings 49 are silicon oxide surfaces.

In one embodiment, the silicon oxide layer 501 can be formed by deposition of silicon oxide by a conformal deposition method such as low pressure chemical vapor deposition (LPCVD) or atomic layer deposition (ALD). Alternatively, the silicon oxide layer 501 may be formed by depositing a silicon nitride layer followed by oxidizing the entire thickness of the silicon nitride layer using in-situ steam generation (ISSG) oxidation. In this case, the silicon oxide layer 501 layer may contain some nitrogen (e.g., comprise an oxygen rich silicon oxynitride layer). In case the silicon oxide layer 501 is deposited employing a silicon oxide precursor such as tetraethylorthosilicate (TEOS), residual carbon atoms can be present in the silicon oxide layer 501. For example, the silicon oxide layer 501 can include carbon at an atomic concentration greater than $1.0 \times 10^{19}/cm^3$, such as about $1.0 \times 10^{20}/cm^3$ to about $1.0 \times 10^{21}/cm^3$. The thickness of the silicon oxide layer 501 can be in a range from 1 nm to 30 nm, such as from 2 nm to 10 nm, although lesser and greater thicknesses can also be employed. The at least one silicon oxide portion, as embodied by the silicon oxide layer 501, comprises a horizontal silicon oxide portion 501H that is formed on a top surface of each epitaxial channel portion 11, i.e., the portion of the silicon oxide layer 501 that contacts the top surface of a respective epitaxial channel portion 11.

Referring to FIG. 2D, a silicon nitride layer 502 is formed within the memory openings 49. The silicon nitride layer 502 can be formed as a single continuous layer that covers the entire area of the silicon oxide layer 501. In one embodiment, the silicon nitride layer 502 can be formed by deposition of silicon nitride employing a conformal deposition method such as low pressure chemical vapor deposition (LPCVD) or atomic layer deposition. Alternatively, the silicon nitride layer 502 can be formed by nitridation of surface portions of the silicon oxide layer 501. Any suitable nitridation method may be used, such as slot plasma antenna nitridation method to convert the surface portion of the silicon oxide layer 501 to the silicon nitride layer 502, while leaving a portion of the silicon oxide layer 501 under the silicon nitride layer.

Referring to FIG. 2E, a series of layers including a blocking dielectric layer 503L, a continuous memory material layer 504L, a tunneling dielectric layer 506L, and an optional first semiconductor channel layer 601L can be sequentially deposited in the memory openings 49. The blocking dielectric layer 503L may include a single dielectric material layer or a stack of multiple dielectric material layers.

The blocking dielectric layer 503L includes at least one dielectric material, which can be silicon oxide, a dielectric metal oxide, or a combination thereof. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 503L can include a dielectric metal oxide having a dielectric constant greater than 7.9, i.e., having a dielectric constant greater than the dielectric constant of silicon nitride. Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide can be deposited, for example, by chemical vapor deposition (CVD), atomic layer deposition (ALD), pulsed laser deposition (PLD), liquid source misted chemical deposition, or a combination thereof. Additionally or alternately, the blocking dielectric layer 503L can include silicon oxide, silicon oxynitride, silicon nitride, or a combination thereof. In one embodiment, the blocking dielectric layer 503 can include a stack of aluminum oxide and silicon oxide. The blocking dielectric layer 503L can be formed by a conformal deposition method such as low pressure chemical vapor deposition, plasma enhanced chemical vapor deposition (e.g., conformal film deposition and/or radical oxidation), atomic layer deposition, or a combination thereof. The thickness of the blocking dielectric layer 503L can be in a range from 1 nm to 30 nm, although lesser and greater thicknesses can also be employed.

The continuous memory material layer 504, the tunneling dielectric layer 506L, and the optional first semiconductor channel layer 601L can be sequentially formed. In one embodiment, the continuous memory material layer 504L can be a charge trapping material including a dielectric charge trapping material, which can be, for example, silicon nitride. Alternatively, the continuous memory material layer 504L can include a conductive material such as doped polysilicon or a metallic material that is patterned into multiple electrically isolated portions (e.g., floating gates), for example, by being formed within lateral recesses into sacrificial material layers 42. In one embodiment, the continuous memory material layer 504L includes a silicon nitride layer.

The continuous memory material layer 504L can be formed as a single memory material layer of homogeneous composition, or can include a stack of multiple memory material layers. The multiple memory material layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the continuous memory material layer 504L may comprise an insulating charge trapping material, such as one or more silicon nitride segments. Alternatively, the continuous memory material layer 504L may comprise conductive nanoparticles such as metal nanoparticles, which can be, for example, ruthenium nanoparticles. The continuous memory material layer 504L can be formed, for example, by chemical vapor deposition (CVD), atomic layer deposition (ALD), physical vapor deposition (PVD), or any suitable deposition technique for storing electrical charges therein. The thickness of the continuous memory material layer 504L can be in a range from 2 nm to 20 nm, although lesser and greater thicknesses can also be employed.

The tunneling dielectric layer 506L includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 506L can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 506L can include a stack of a first silicon oxide layer, a silicon oxynitride layer, and a second silicon oxide layer, which is commonly known as an ONO stack. In one embodiment, the tunneling dielectric layer 506L can include a silicon oxide layer that is substantially free of carbon or a silicon oxynitride layer that is substantially free of carbon. The thickness of the tunneling dielectric layer 506L can be in a range from 2 nm to 20 nm, although lesser and greater thicknesses can also be employed.

The optional first semiconductor channel layer 601L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601L includes amorphous silicon or polysilicon. The first semiconductor channel layer 601L can be formed by a conformal deposition method such as low pressure chemical vapor deposition (LPCVD). The thickness of the first semiconductor channel layer 601L can be in a range from 2 nm to 10 nm, although lesser and greater thicknesses can also be employed. A cavity 49' is formed in the volume of each memory opening 49 that is not filled with the deposited material layers (503L, 504L, 506L, 601L).

Referring to FIG. 2F, the optional first semiconductor channel layer 601L, the tunneling dielectric layer 506L, the continuous memory material layer 504L, the blocking dielectric layer 503L, the cover silicon nitride layer 502 and the cover silicon oxide layer 501 are sequentially anisotropically etched employing at least one anisotropic etch process. The portions of the first semiconductor channel layer 601L, the tunneling dielectric layer 506L, the continuous memory material layer 504L, the blocking dielectric layer 503L, the cover silicon nitride layer 502 and the cover silicon oxide layer 501 located above the top surface of the insulating cap layer 70 can be removed by the at least one anisotropic etch process. Further, the horizontal portions of the first semiconductor channel layer 601L, the tunneling dielectric layer 506L, the continuous memory material layer 504L, the blocking dielectric layer 503L, the cover silicon nitride layer 502 and the cover silicon oxide layer 501 at a bottom of each cavity 49' can be removed to form openings in remaining portions thereof. Each of the first semiconductor channel layer 601L, the tunneling dielectric layer 506L, the continuous memory material layer 504L, the blocking dielectric layer 503L, the cover silicon nitride layer 502 and the cover silicon oxide layer 501 can be etched by an anisotropic etch process.

Each remaining portion of the first semiconductor channel layer 601L constitutes a first semiconductor channel portion 601. Each remaining portion of the tunneling dielectric layer 506L constitutes a tunneling dielectric 506. Each remaining portion of the continuous memory material layer 504L is herein referred to as a memory material layer 504. The memory material layer 504 can comprise a charge trapping material or a floating gate material. In one embodiment, each memory material layer 504 can include a vertical stack of memory elements embodied as charge storage regions that store electrical charges upon programming. In one embodiment, the memory material layer 504 can be a charge storage layer in which each portion adjacent to the sacrificial material layers 42 constitutes a memory element, i.e., a charge storage region. Each remaining portion of the blocking dielectric layer 503L is herein referred to as a blocking dielectric 503. The cover silicon nitride layer 502 and the cover silicon oxide layer 501 function as vertical etch stop layers during backside recess etching, as will be described below.

A surface of the epitaxial channel portion 11 (or a surface of the semiconductor substrate layer 10 in case the epitaxial channel portions 11 are not employed) can be physically exposed underneath the opening through the first semiconductor channel portion 601, the tunneling dielectric 506, the memory material layer 504, the blocking dielectric 503, the cover silicon nitride layer 502 and the cover silicon oxide layer 501. Optionally, the physically exposed semiconductor surface at the bottom of each cavity 49' can be vertically recessed so that the recessed semiconductor surface underneath the cavity 49' is vertically offset from the topmost surface of the epitaxial channel portion 11 (or of the semiconductor substrate layer 10 in case epitaxial channel portions 11 are not employed) by a recess distance. A tunneling dielectric 506 is located over the memory material layer 504. A set of a blocking dielectric 503, a memory material layer 504, and a tunneling dielectric 506 in a memory opening 49 constitutes a memory film 50, which includes a plurality of charge storage regions (as embodied as the memory material layer 504) that are insulated from surrounding materials by the blocking dielectric 503 and the tunneling dielectric 506.

In one embodiment, the first semiconductor channel portion 601, the tunneling dielectric 506, the memory material layer 504, the second blocking dielectric 503, and the cover silicon oxide layer 501 can have vertically coincident sidewalls. As used herein, a first surface is "vertically coincident" with a second surface if there exists a vertical plane including both the first surface and the second surface. Such a vertical plane may, or may not, have a horizontal curvature, but does not include any curvature along the vertical direction, i.e., extends straight up and down.

Referring to FIG. 2G, a second semiconductor channel layer 602L can be deposited directly on the semiconductor surface of the epitaxial channel portion 11 or the semiconductor substrate layer 10 if portion 11 is omitted, and directly on the first semiconductor channel portion 601. The second semiconductor channel layer 602L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602L includes amorphous silicon or polysilicon. The second semiconductor channel layer 602L can be formed by a conformal deposition method such as low pressure chemical vapor deposition (LPCVD). The thickness of the second semiconductor channel layer 602L can be in a range from 2 nm to 10 nm, although lesser and greater thicknesses can also be employed. The second semiconductor channel layer 602L may partially fill the cavity 49' in each memory opening, or may fully fill the cavity in each memory opening.

The materials of the first semiconductor channel portion 601 and the second semiconductor channel layer 602L are collectively referred to as a semiconductor channel material. In other words, the semiconductor channel material is a set of all semiconductor material in the first semiconductor channel portion 601 and the second semiconductor channel layer 602L.

Referring to FIG. 2H, in case the cavity 49' in each memory opening is not completely filled by the second semiconductor channel layer 602L, a dielectric core layer 62L can be deposited in the cavity 49' to fill any remaining portion of the cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 2I, the horizontal portion of the dielectric core layer 62L can be removed, for example, by a recess etch from above the top surface of the insulating cap layer 70. Each remaining portion of the dielectric core layer 62L constitutes a dielectric core 62. Further, the horizontal portion of the second semiconductor channel layer 602L located above the top surface of the insulating cap layer 70 can be removed by a planarization process, which can employ a recess etch or chemical mechanical planarization (CMP). Each remaining portion of the second semiconductor channel layer 602L within a memory opening constitutes a second semiconductor channel portion 602.

Each adjoining pair of a first semiconductor channel portion 601 and a second semiconductor channel portion 602 can collectively form a polycrystalline semiconductor channel 60 through which electrical current can flow when a vertical NAND device including the polycrystalline semiconductor channel 60 is turned on. A tunneling dielectric 506 is surround by a memory material layer 504 which laterally surrounds a portion of the polycrystalline semiconductor channel 60. Each adjoining set of blocking dielectric 503, a memory material layer 504, and a tunneling dielectric 506 collectively constitute a memory film 50, which can store electrical charges with a macroscopic retention time. In some embodiments, blocking dielectric may be subsequently formed after formation of backside recesses. As used herein, a macroscopic retention time refers to a retention time suitable for operation of a memory device as a permanent memory device such as a retention time in excess of 24 hours.

Referring to FIG. 2J, the top surface of each dielectric core 62 can be further recessed within each memory opening, for example, by a recess etch to a depth that is located between the top surface of the insulating cap layer 70 and the bottom surface of the insulating cap layer 70. Drain regions 63 can be formed by depositing a doped semiconductor material within each recessed region above the dielectric cores 62. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the drain regions 63.

The exemplary memory stack structure 55 can be embedded into the first exemplary structure illustrated in FIG. 1. FIG. 3 illustrates the first exemplary structure that incorporates multiple instances of the exemplary memory stack structure of FIG. 2J. Each memory stack structure includes from outside to inside, a blocking dielectric 503, memory elements (as embodied vertically spaced portions of the memory material layer 504 located at each sacrificial material layers 142), a tunneling dielectric 506, and a polycrystalline semiconductor channel 60. The cover layers 501 and/or 502 may optionally be considered part of the memory stack structure 55. Each exemplary memory stack structure 55 includes a semiconductor channel (601, 602); a tunneling dielectric layer 506 laterally surrounding the semiconductor channel (601, 602); and a vertical stack of charge storage regions laterally surrounding the tunneling dielectric layer 506 (as embodied as a memory material layer 504). The first exemplary structure includes a semiconductor device, which comprises a stack (32, 42) including an alternating plurality of material layers (e.g., the sacrificial material layers 42) and insulating layers 32 located over a semiconductor substrate (e.g., over the semiconductor substrate layer 10), and a memory opening extending through the stack (32, 42). The semiconductor device further comprises a cover silicon oxide layer 501 (which may also be referred to as a first blocking dielectric 501 when layer 503 is referred to as a second blocking dielectric) vertically extending from a bottommost layer (e.g., the bottommost sacrificial material layer 42) of the stack to a topmost layer (e.g., the topmost sacrificial material layer 42) of the stack, and contacting a sidewall of the memory opening and a horizontal surface of the semiconductor substrate. While the present disclosure is described employing the illustrated configuration for the memory stack structure, the methods of the present disclosure can be applied to alternative memory stack structures.

Figure 4:
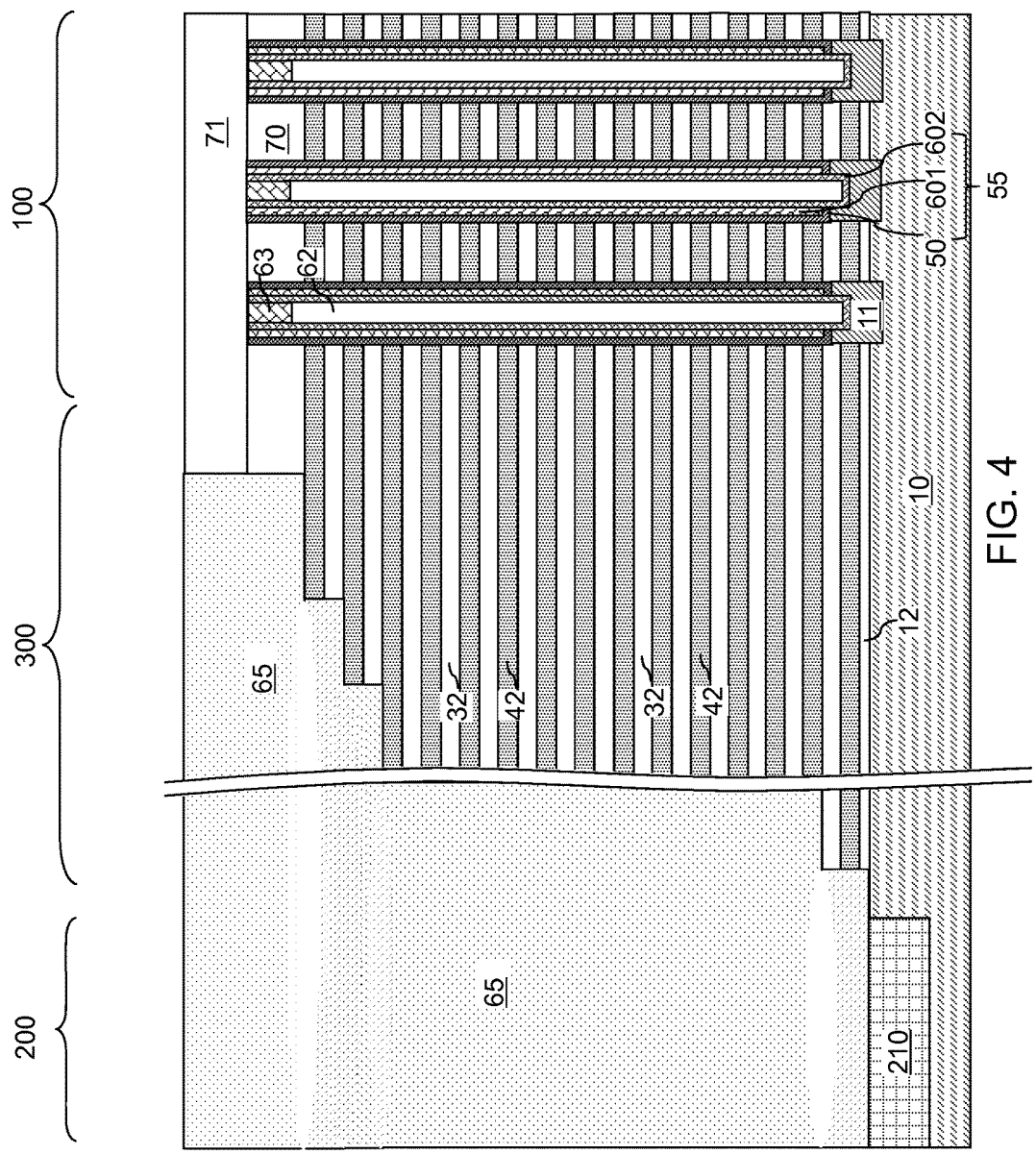
FIG. 4 is a vertical cross-sectional view of the first exemplary structure after formation of a set of stepped surfaces and a retro-stepped dielectric material portion according to the first embodiment of the present disclosure.

Referring to FIG. 4, an optional first contact level dielectric layer 71 can be formed over the semiconductor substrate layer 10. As an optional structure, the first contact level dielectric layer 71 may, or may not, be formed. In case the first contact level dielectric layer 71 is formed, the first contact level dielectric layer 71 includes a dielectric material such as silicon oxide, silicon nitride, silicon oxynitride, porous or non-porous organosilicate glass (OSG), or a combination thereof. If an organosilicate glass is employed, the organosilicate glass may, or may not, be doped with nitrogen. The first contact level dielectric layer 71 can be formed over a horizontal plane including the top surface of the insulating cap layer 70 and the top surfaces of the drain regions 63. The first contact level dielectric layer 71 can be deposited by chemical vapor deposition, atomic layer deposition (ALD), spin-coating, or a combination thereof. The thickness of the first contact level dielectric layer 71 can be in a range from 10 nm to 300 nm, although lesser and greater thicknesses can also be employed.

In one embodiment, the first contact level dielectric layer 71 can be formed as a dielectric material layer having a uniform thickness throughout. The first contact level dielectric layer 71 may be formed as a single dielectric material layer, or can be formed as a stack of a plurality of dielectric material layers. Alternatively, formation of the first contact level dielectric layer 71 may be merged with formation of at least one line level dielectric layer (not shown). While the present disclosure is described employing an embodiment in which the first contact level dielectric layer 71 is a structure separate from an optional second contact level dielectric layer or at least one line level dielectric layer to be subsequently deposited, embodiments in which the first contact level dielectric layer 71 and at least one line level dielectric layer are formed at a same processing step, and/or as a same material layer, are expressly contemplated herein.

In one embodiment, the first contact level dielectric layer 71, the insulating cap layer 70, and the alternating stack (32, 42) can be removed from the peripheral device region 200, for example, by a masked etch process. In addition, a stepped cavity can be formed within the contact region 300 by patterning a portion of the alternating stack (32, 42). As used herein, a "stepped cavity" refers to a cavity having stepped surfaces. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "step" refers to a vertical shift in the height of a set of adjoined surfaces.

The stepped cavity can have various stepped surfaces such that the horizontal cross-sectional shape of the stepped cavity changes in steps as a function of the vertical distance from the top surface of the semiconductor substrate layer 10. In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating stack is defined as the relative position of a pair of a first material layer and a second material layer within the structure. After formation of all stepped surfaces, mask material layers employed to form the stepped surfaces can be removed, for example, by ashing. Multiple photoresist layers and/or multiple etch processes can be employed to form the stepped surfaces.

A dielectric material such as silicon oxide is deposited in the stepped cavity and over the peripheral devices 210 in the peripheral device region 200. Excess portions of the deposited dielectric material can be removed from above the top surface of the first contact level dielectric layer 71, for example, by chemical mechanical planarization (CMP). The remaining portion of the deposited dielectric material filling the stepped cavity in the contact region 300 and overlying the semiconductor substrate layer 10 in the peripheral device region 200 constitutes a retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed as the dielectric material, the silicon oxide of the retro-stepped dielectric material portion 65 may, or may not, be doped with dopants such as B, P, and/or F. The top surface of the retro-stepped dielectric material portion 65 can be coplanar with the top surface of the first contact level dielectric layer 71.

The region over the peripheral devices 210 and the region over the stepped cavities can be filled simultaneously with the same dielectric material, or can be filled in different processing steps with the same dielectric material or with different dielectric materials. The cavity over the peripheral devices 210 can be filled with a dielectric material prior to, simultaneously with, or after, filling of the cavity over the stepped surface of the contact region 300 with a dielectric material. While the present disclosure is described employing an embodiment in which the cavity in the peripheral device region 200 and the stepped cavity in the contact region 300 are filled simultaneously, embodiments are expressly contemplated herein in which the cavity in the peripheral device region 200 and the stepped cavity in the contact region 300 are filled in different processing steps.

Figure 5:
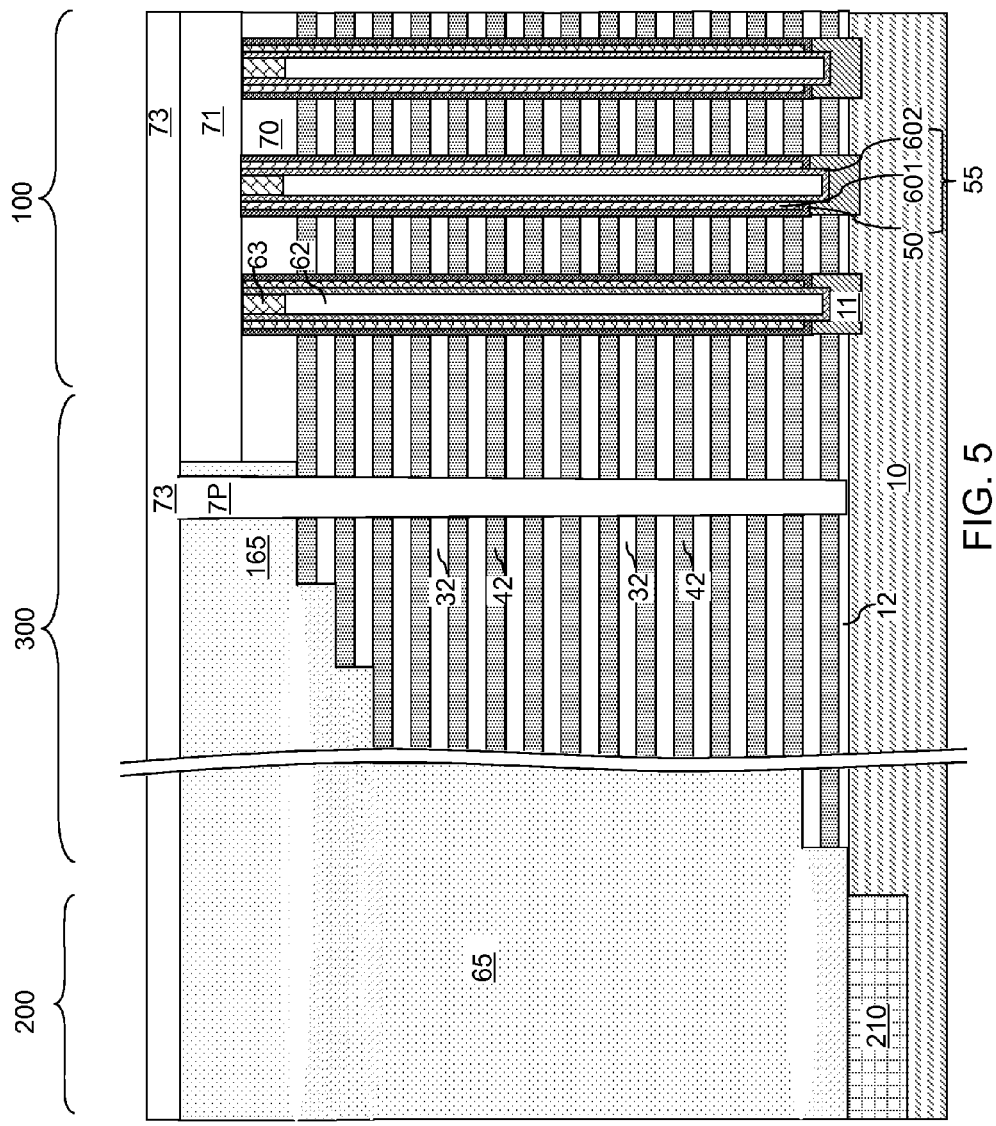
FIG. 5 is a vertical cross-sectional view of the first exemplary structure after formation of dielectric pillar structures according to the first embodiment of the present disclosure.

Referring to FIG. 5, dielectric support pillars 7P may be optionally formed through the retro-stepped dielectric material portion 65 and/or through the first contact level dielectric layer 71 and/or through the alternating stack (32, 42). In one embodiment, the dielectric support pillars 7P can be formed in the contact region 300, which is located adjacent to the device region 100. The dielectric support pillars 7P can be formed, for example, by forming an opening extending through the retro-stepped dielectric material portion 65 and/or through the alternating stack (32, 42) and at least to the top surface of the semiconductor substrate layer 10, and by filling the opening with a dielectric material that is resistant to the etch chemistry to be employed to remove the sacrificial material layers 42.

In one embodiment, the dielectric support pillars 7P can include silicon oxide and/or a dielectric metal oxide such as aluminum oxide. In one embodiment, the portion of the dielectric material that is deposited over the first contact level dielectric layer 71 concurrently with deposition of the dielectric support pillars 7P can be present over the first contact level dielectric layer 71 as a second contact level dielectric layer 73. Each of the dielectric support pillars 7P and the second contact level dielectric layer 73 is an optional structure. As such, the second contact level dielectric layer 73 may, or may not, be present over the insulating cap layer 70 and the retro-stepped dielectric material portion 65. The first contact level dielectric layer 71 and the second contact level dielectric layer 73 are herein collectively referred to as at least one contact level dielectric layer (71, 73). In one embodiment, the at least one contact level dielectric layer (71, 73) can include both the first and second contact level dielectric layers (71, 73), and optionally include any additional via level dielectric layer that can be subsequently formed. In another embodiment, the at least one contact level dielectric layer (71, 73) can include only the first contact level dielectric layer 71 or the second contact level dielectric layer 73, and optionally include any additional via level dielectric layer that can be subsequently formed. Alternatively, formation of the first and second contact level dielectric layers (71, 73) may be omitted, and at least one via level dielectric layer may be subsequently formed, i.e., after formation of a first source contact via structure.

The second contact level dielectric layer 73 and the dielectric support pillars 7P can be formed as a single continuous structure of integral construction, i.e., without any material interface therebetween. In another embodiment, the portion of the dielectric material that is deposited over the first contact level dielectric layer 71 concurrently with deposition of the dielectric support pillars 7P can be removed, for example, by chemical mechanical planarization or a recess etch. In this case, the second contact level dielectric layer 73 is not present, and the top surface of the first contact level dielectric layer 71 can be physically exposed.

Figure 6B:
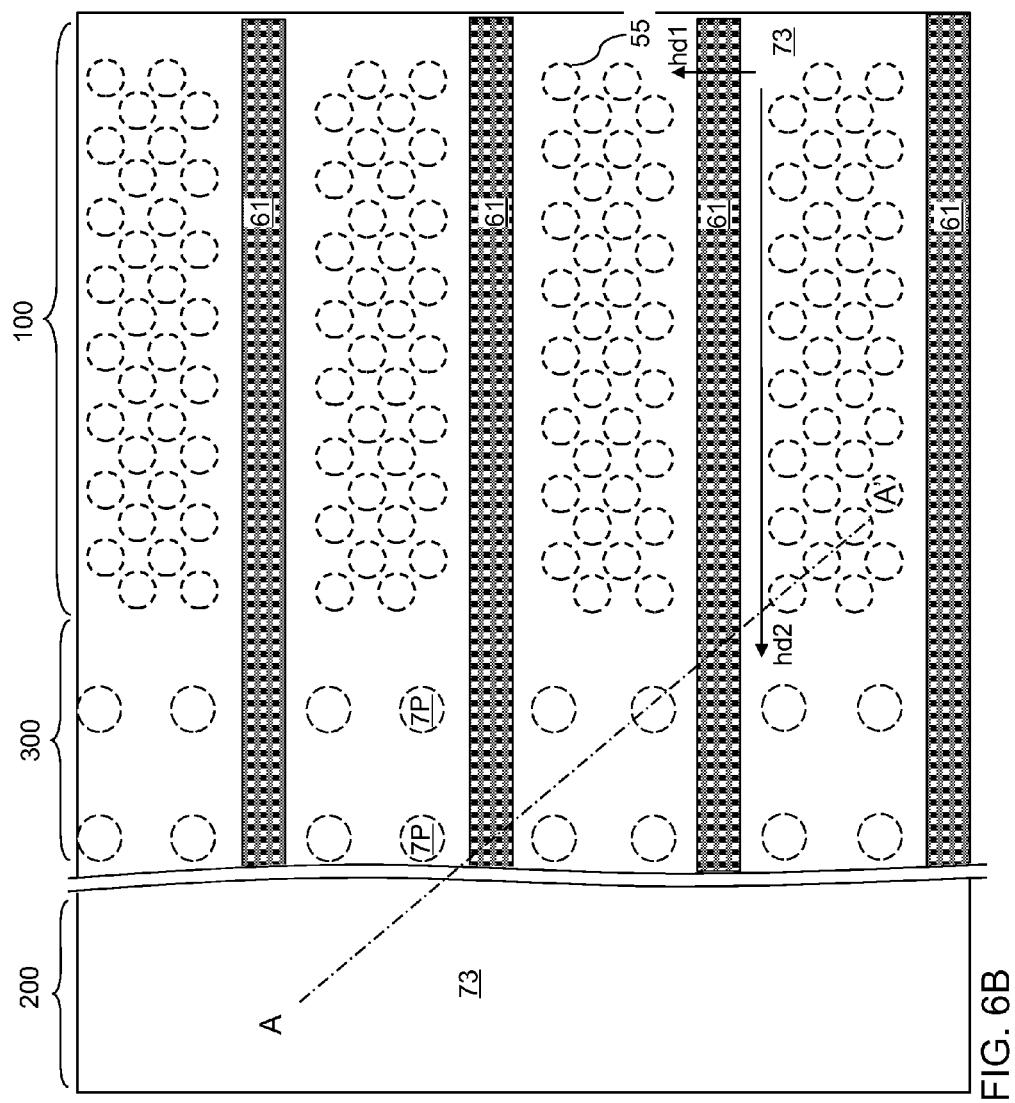
FIG. 6B is a see-through top-down view of the first exemplary structure of FIG. 6A. The vertical plane A-A' is the plane of the vertical cross-sectional view of FIG. 6A.

Referring to FIGS. 6A and 6B, a photoresist layer (not shown) can be applied over the at least one contact level dielectric layer (71, 73), and can be lithographically patterned to form openings within areas between the memory blocks. In one embodiment, the memory blocks can be laterally spaced from one another along a first horizontal direction hd1 (e.g., bit line direction), and the dimension of each opening in the photoresist layer along the first horizontal direction hd1 can be less than the spacing between neighboring clusters (i.e., sets) of the memory stack structures 55 along the second horizontal direction hd2 (e.g., word line direction). Further, the dimension of each opening in the photoresist layer along a second horizontal direction hd2 (which is parallel to the lengthwise direction of each cluster of memory stack structures 55) can be greater than the extent of each cluster of the memory stack structures 55 along the first horizontal direction hd1.

Backside trenches 79 can be formed between each neighboring pair of clusters of the memory stack structures 55 by transferring the pattern of the openings in the photoresist layer through the at least one contact level dielectric layer (71, 73), the retro-stepped dielectric material portion 65, and the alternating stack (32, 42). A top surface of the semiconductor substrate layer 10 can be physically exposed at the bottom of each backside trench 79. In one embodiment, each backside trench 79 can extend along the second horizontal direction hd2 so that clusters of the memory stack structures 55 are laterally spaced along the first horizontal direction hd1. Each cluster of memory stack structures 55 in conjunction with the portions of the alternating stack (32, 42) that surround the cluster constitutes a memory block. Each memory block is laterally spaced from one another by the backside trenches 79.

In one embodiment, source regions 61 can be formed in, or on, portions of the semiconductor substrate layer 10 underlying the backside trenches 79 by implantation of dopants of a second conductivity type (which is the opposite of the first conductivity type) after formation of the backside trenches 79. For example, if the first conductivity type is p-type, the second conductivity type is n-type, and vice versa.

Referring to FIG. 7A, an etchant that selectively etches the second material of the sacrificial material layers 42 with respect to the first material of the insulating layers 32 can be introduced into the backside trenches 79, for example, employing an etch process. Backside recesses 43 are formed in volumes from which the sacrificial material layers 42 are removed. The removal of the second material of the sacrificial material layers 42 can be selective to the first material of the insulating layers 32, the material of the dielectric support pillars 7P, the material of the retro-stepped dielectric material portion 65, the semiconductor material of the semiconductor substrate layer 10, and the material of the at least one silicon oxide portion formed at the processing step of FIG. 2C (i.e., the cover silicon oxide layer 501). In one embodiment, the sacrificial material layers 42 can include silicon nitride, and the materials of the insulating layers 32, the dielectric support pillars 7P, and the retro-stepped dielectric material portion 65 can be selected from silicon oxide and dielectric metal oxides. In another embodiment, the sacrificial material layers 42 can include a semiconductor material such as polysilicon, and the materials of the insulating layers 32, the dielectric support pillars 7P, and the retro-stepped dielectric material portion 65 can be selected from silicon oxide, silicon nitride, and dielectric metal oxides. In this case, the depth of the backside trenches 79 can be modified so that the bottommost surface of the backside trenches 79 is located within the gate dielectric layer 12, i.e., to avoid physical exposure of the top surface of the semiconductor substrate layer 10. Since the etch process is selective to the silicon oxide of the cover silicon oxide layer 501, the cover silicon oxide layer 501 acts as an etch stop layer and remains substantially intact after this etch process. In other words, the amount of etching from the cover silicon oxide layer 501 may be insignificant.

The etch process that removes the second material of layers 42 selective to the cover silicon oxide layer 501 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the first exemplary structure is immersed within a wet etch tank including phosphoric acid, which etches silicon nitride selective to silicon oxide, silicon, and various other materials employed in the art. The dielectric support pillars 7P, the retro-stepped dielectric material portion 65, and the memory stack structures 55 provide structural support while the backside recesses 43 are present within volumes previously occupied by the sacrificial material layers 42.

Referring to FIG. 7B, physically exposed portions of the at least one silicon oxide portion (i.e., the cover silicon oxide layer 501) can be removed selective to the cover silicon nitride layer 502 from the backside recesses 43 employing another etch process. For example, a wet etch employing dilute hydrofluoric acid or a vapor phase etch employing hydrofluoric acid vapor can be employed to isotropically etch the physically exposed portions of the cover silicon oxide layer 501 using the cover silicon nitride layer 502 as an etch stop. Unetched portions of the at least one silicon oxide portion as formed at the processing step of FIG. 2C (i.e., the cover silicon oxide layer 501) remain as annular silicon oxide spacers 51 at each level of the insulating layers 32 and at the level of the dielectric cap layer 70 after removal of the physically exposed portions of the at least one silicon oxide portion. In other words, remaining unetched portions of the cover silicon oxide layer 501 constitute the annular silicon oxide spacers 51, which are present at each level of the insulating layers 32 and at the level of the dielectric cap layer 70.

An unetched portion of the cover silicon oxide layer 501 remains between the bottommost surface of the cover silicon nitride layer 502 and the top surface of the epitaxial channel portion 11 within each memory opening. This unetched portion of the cover silicon oxide layer 501 is herein referred to as a silicon oxide plate 151, which is present on a top surface of a respective epitaxial channel portion 11 after removal of the physically exposed portions of the cover silicon oxide layer 501 and formation of the annular silicon oxide spacers 51.

Figure 8:
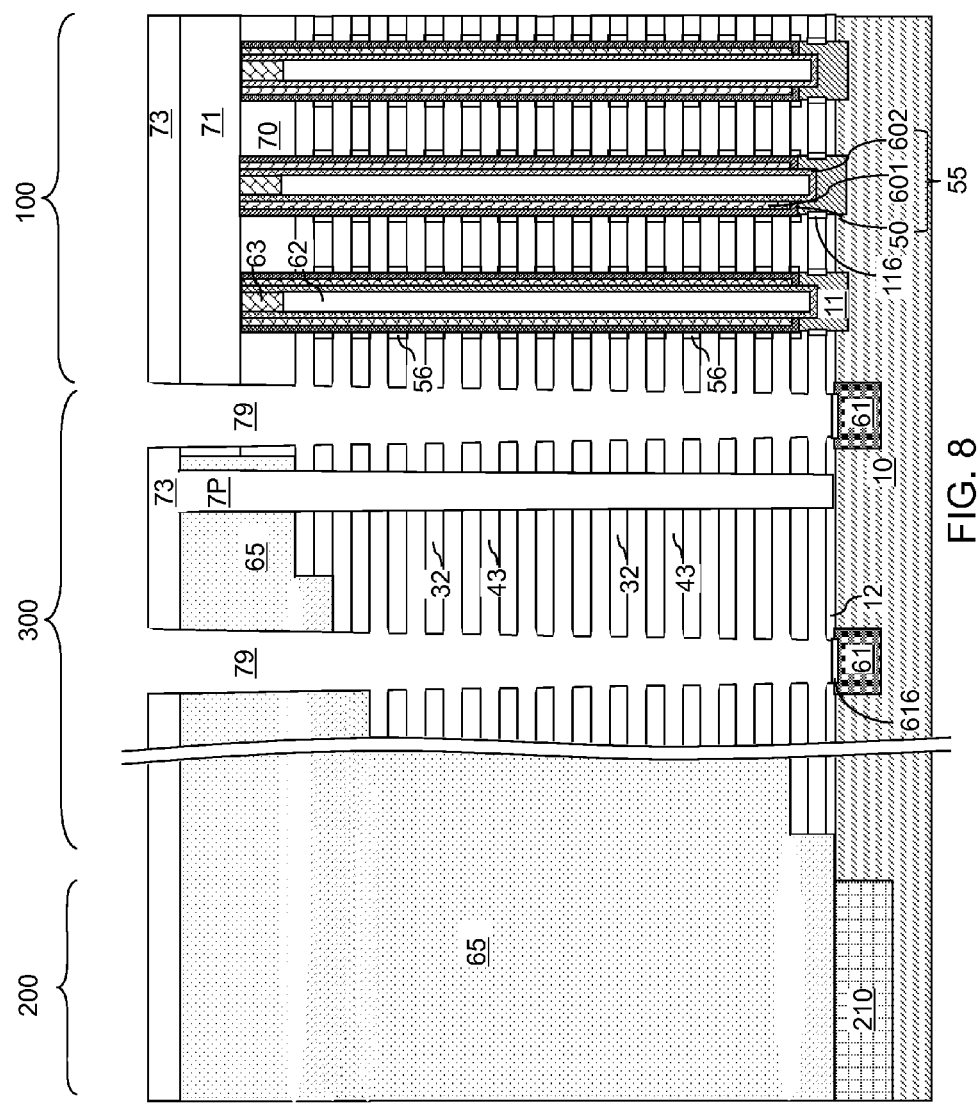
FIG. 8 is a vertical cross-sectional view of the first exemplary structure after formation of the backside recesses according to the first embodiment of the present disclosure.

Referring to FIGS. 7C and 8, dielectric spacers 116 and sacrificial dielectric portions 616 can be optionally formed. Specifically, physically exposed surface portions of epitaxial channel portions 11 and the source regions 61 can be converted into dielectric material portions by thermal conversion and/or plasma conversion of the semiconductor materials into dielectric materials. For example, thermal conversion and/or plasma conversion can be employed to convert a surface portion of each epitaxial channel portion 11 into a dielectric spacer 116, and to convert a surface portion of each source region 61 into a sacrificial dielectric portion 616 (see FIG. 8 for element 616).

In one embodiment, each dielectric spacer 116 can be topologically homeomorphic to a torus, i.e., generally ring-shaped. As used herein, an element is topologically "homeomorphic to a torus," and "has an annular shape" if the shape of the element can be continuously stretched without destroying a hole or forming a new hole into the shape of a torus. The dielectric spacers 116 include a dielectric material that includes the same semiconductor element as the epitaxial channel portions 11 and additionally includes at least one non-metallic element such as oxygen such that the material of the dielectric spacers 116 is a dielectric material. In one embodiment, the dielectric spacers 116 can include a dielectric oxide of the semiconductor material of the epitaxial channel portions 11 (such as silicon oxide or a silicon-germanium oxide). Likewise, each sacrificial dielectric portion 616 includes a dielectric material that includes the same semiconductor element as the source regions 61 and additionally includes at least one non-metallic element such as oxygen such that the material of the sacrificial dielectric portions 616 is a dielectric material. In one embodiment, the sacrificial dielectric portions 616 can include a dielectric oxide of the semiconductor material of the source region 61 (such as silicon oxide).

Referring to FIGS. 7D and 8, physically exposed portions of the cover silicon nitride layer 502 are removed selective to the memory stack structures (50, 60) by an etch process, which can be an isotropic etch process that is selective to the dielectric material of the insulating layers 32 and the blocking dielectric 503, which acts as an etch stop. The backside recesses 43 are expanded in volume by the volumes of the portions of the cover silicon nitride layer 502 that are removed, and portions of the outer surfaces of the memory stack structures (50, 60) (i.e., the outer surfaces of the blocking dielectrics 503) are physically exposed to the backside recesses 43.

Unetched portions of the cover silicon nitride layer 502 remain as annular silicon nitride spacers 52 at each level of the insulating layers 32 and at the level of the dielectric cap layer 70 after removal of the physically exposed portions of the cover silicon nitride layer 502. In other words, each remaining portion of the cover silicon nitride layer 502 located above the top surface of the epitaxial channel portions 11 constitutes an annular silicon nitride spacer 52. The annular silicon nitride spacers 52 are present at each level of the insulating layers 32 and at the level of the dielectric cap layer 70. Each physically adjoining pair of an annular silicon oxide spacer 51 and an annular silicon nitride spacer 52 constitutes an annular spacer structure 56.

An unetched portion of the cover silicon nitride layer 502 remains between the top surface of the silicon oxide plate 151 and the bottommost surface of the blocking dielectric 503 within each memory opening. This unetched portion of the cover silicon nitride layer 502 is herein referred to as a silicon nitride plate 152, which is present over a respective epitaxial channel portion 11 and on a top surface of a respective silicon oxide plate 151 after removal of the physically exposed portions of the cover silicon oxide layer 501 and formation of the annular silicon oxide spacers 51. Within each memory opening, the memory stack structure 55 comprises a tunneling dielectric 506, and the topmost surface of the silicon oxide plate 151 is located below the horizontal plane including the bottommost surface of the tunneling dielectric 506. Each vertical stack of a silicon oxide plate 151 and a silicon nitride plate 152 is herein referred to as a dielectric plate structure (151, 152).

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42, the material of cover the silicon oxide layer 501, and the material of the cover silicon nitride layer 502 are removed. The memory openings in which the memory stack structures 55 formed are herein referred to as front side recesses or front side cavities in contrast with the backside recesses 43. In one embodiment, the device region 100 comprises an array of monolithic three-dimensional NAND strings having a plurality of device levels disposed above the substrate (e.g., above the semiconductor substrate layer 10). In this case, each backside recess 43 can define a space for receiving a respective word line of the array of monolithic three-dimensional NAND strings.

Each of the plurality of backside recesses 43 can extend substantially parallel to the top surface of the semiconductor substrate layer 10. A backside recess 43 can be vertically bounded by a top surface of an underlying insulating layer 32 and a bottom surface of an overlying insulating layer 32. In one embodiment, each backside recess 43 can have a uniform height throughout.

Figure 9A:
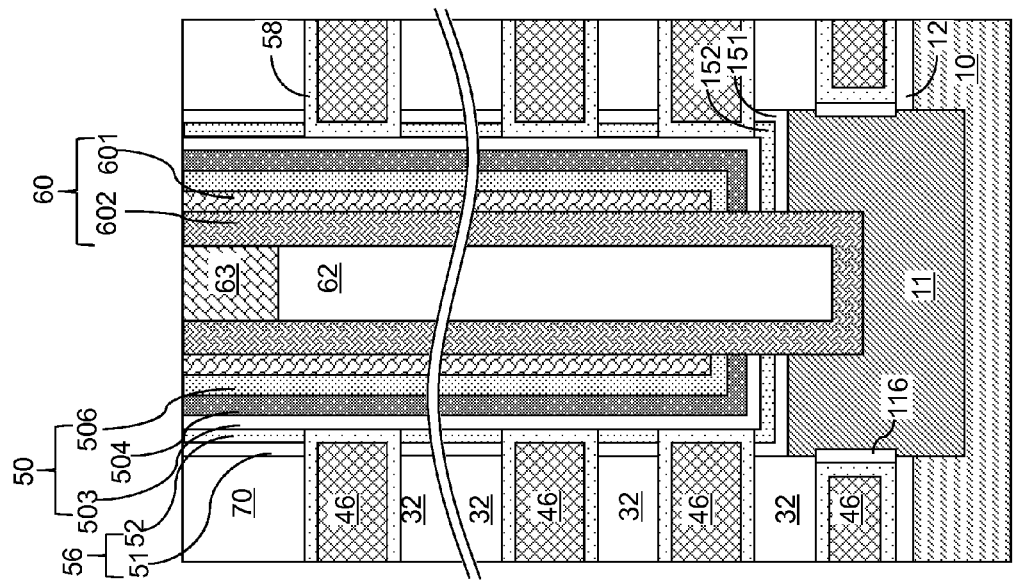
Figure 9B:
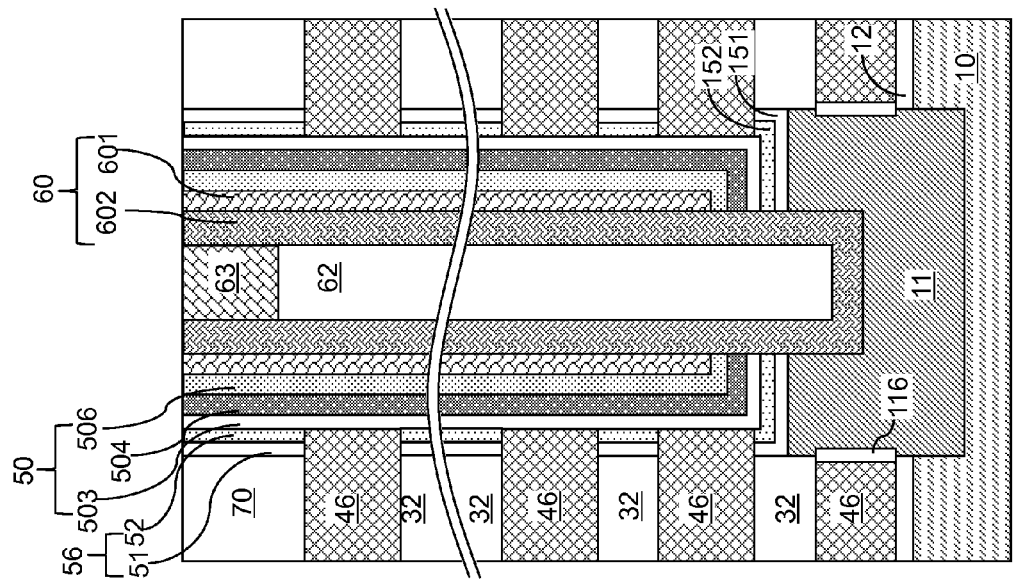

Referring to FIGS. 9A-9C, magnified views of a region around a memory stack structure 55 are shown for various embodiments of the first exemplary structure after formation of electrically conductive layers 46. Each of FIGS. 9A-9C illustrate different embodiments of the region around the memory stack structure 55. To form the electrically conductive layers 46, at least one metallic material can be deposited in the backside recesses 43 and over the sidewalls of the backside trenches 79.

In one embodiment, the at least one metallic material can be deposited directly on the sidewalls and horizontal surfaces of the insulating layers 32, the physically exposed surfaces of the annular silicon oxide spacers 51 and the silicon nitride spacers 52, and physically exposed portions of the outer sidewalls of the memory films 50 as illustrated in FIG. 9A. Alternatively, a backside blocking dielectric layer 58 can be formed in the backside recesses 43, on the sidewalls of the backside trenches 79, and over the top surface of the at least one contact level dielectric layer (71, 73) prior to deposition of the at least one metallic material as illustrated in FIG. 9B or 9C. FIG. 9B illustrates an embodiment in which dielectric spacers 116 and sacrificial dielectric portions 616 are employed. FIG. 9C illustrates an embodiment in which dielectric spacers 116 and sacrificial dielectric portions 616 are omitted.

The backside blocking dielectric layer 58, if employed, can include any of the material that can be employed for the blocking dielectric layer 503L. In one embodiment, the backside blocking dielectric layer 58 can include the same material as a component of the blocking dielectric layer 503L. In one embodiment, the backside blocking dielectric layer 58 can include a dielectric material that is different from the dielectric material of the blocking dielectric layer 503. In an illustrative example, the blocking dielectric 503 can include silicon oxide, and the backside blocking dielectric layer 58 can include aluminum oxide.

In one embodiment, the at least one metallic material can include a conductive metallic compound layer such as a conductive metal nitride layer including a conductive metal nitride such as TiN, TaN, or WN, or a conductive metal carbide layer including a conductive metal carbide such as TiC, TaC, or WC. The conductive metallic compound layer can include a metallic material that functions as a barrier material layer, i.e., a material layer that functions as a diffusion barrier for impurity atoms or gases, and/or as an adhesion promoter layer, i.e., a material layer that promotes adhesion of subsequent layers to the insulating layers 32 (in case a backside blocking dielectric layer is not employed) or to a backside blocking dielectric layer (in case a backside blocking dielectric layer is employed). The conductive metallic compound layer can be deposited by a conformal deposition process such as chemical vapor deposition (CVD) or atomic layer deposition (ALD). The thickness of the conductive metallic compound layer can be in a range from 1 nm to 6 nm, although lesser and greater thicknesses can also be employed.

A metal layer including an elemental metal or an intermetallic alloy is deposited in the remaining portions of the backside recesses 43, over the sidewalls of the backside trench 79, and over the top surface of the at least one contact level dielectric layer (71, 73). The metal layer can be deposited as a continuous metal layer directly on the surfaces of the conductive metallic compound layer. The metal layer can be deposited by a conformal deposition method such as chemical vapor deposition (CVD) or atomic layer deposition (ALD). Remaining portions of the backside recesses 43 can be filled with the metal layer. The thickness of the deposited metal, as measured on a sidewall of the backside trench 79, can be greater than one half of the maximum height of the remaining portions of the backside recesses 43 so that the entire volume of each backside recess 43 is filled with the combination of the optional backside blocking dielectric layer 58, the metallic compound layer, and the metal layer.

The metal layer can include a metal such as W, Co, Al, Cu, Ru, Au, Pt, or a combination thereof. The metal layer can be deposited by a chemical vapor deposition (CVD) process or an atomic layer deposition (ALD) process that employs a metal-containing precursor gas. In one embodiment, the metal-containing precursor gas can be free of fluorine, i.e., does not contain fluorine. Chemical vapor deposition or atomic layer deposition of metal employs a metal precursor that can be easily vaporized to leave high-purity metal on a surface without causing surface damage. In one embodiment, an organometallic compound with relatively high vapor pressures and good thermal stability can be employed as the metal precursor gas to deposit metal without requiring hydrogen.

Vertically-extending portions of the deposited metallic material(s) can cover the entirety of the sidewall of the backside trench 79. As deposited, a vertically-extending portion of the deposited metallic material(s) can be continuously adjoined to metal portions located within each vertically neighboring pair of backside recesses 43, and can be adjoined to a horizontal portion of the metal layer that overlies the at least one contact level dielectric layer (71, 73).

The at least one cover silicon oxide layer 501 formed at the processing step of FIG. 2C can include a horizontal silicon oxide portion, which remains as a silicon oxide plate 151 located between a memory stack structure 55 and an epitaxial channel portion 11 after formation of the electrically conductive layers. A backside blocking dielectric layer 58 can contact horizontal surfaces of the insulating layers 32 such that each of the electrically conductive layers 46 is laterally spaced from the blocking dielectrics 503 by the backside blocking dielectric layer 58 as illustrated in FIGS. 9B and 9C. Alternatively, each of the electrically conductive layers 46 can be in physical contact with a respective portion of the outer sidewall of the blocking dielectric 503 as illustrated in FIG. 9A.

Figure 10:
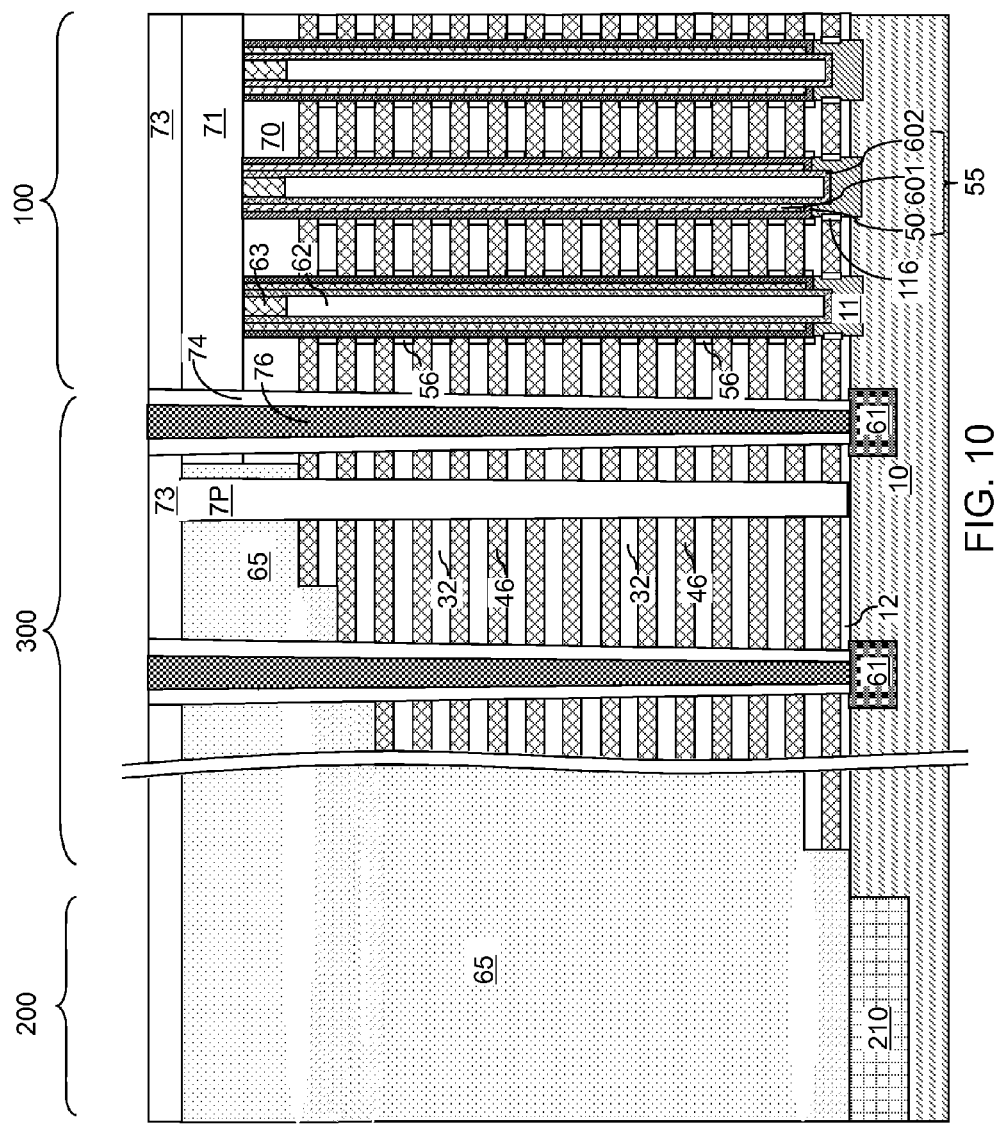
FIG. 10 is a vertical cross-sectional view of the first exemplary structure after formation of backside contact via structures according to the first embodiment of the present disclosure.

Referring to FIG. 10, an etch process can be performed to remove the at least one metallic material from above the at least one contact level dielectric layer (71, 73) and from the sidewalls of the backside trenches 79. The etch process can include an isotropic etch step, an anisotropic etch step, or a combination thereof. In an illustrative example, a reactive ion etch employing at least one halide-containing gas such as $CHF_3$, $CClF_3$, $CF_4$, $SF_6$, $SiF_4$, $Cl_2$, $NF_3$ can be employed for the etch process. Optionally, oxidants such as $O_2$ or $O_3$ can be employed in combination with the at least one halide-containing gas. The electrically conductive layers 46 remain around each backside trench 79 as discrete layers that are electrically isolated from one another.

An insulating spacer 74 can be formed on the sidewalls of each backside trench 79 by deposition of a continuous dielectric material layer and an anisotropic etch of its horizontal portions to expose the metal silicide portion located over the source region 61 on the bottom of the trench 79 and/or to expose the source region 61 if the insulating spacer 74 etch also etches the metal silicide portion on the bottom of the trench 79. Any remaining portion of the sacrificial dielectric portions 616 can be removed prior to, or during, formation of the insulating spacer 74. For example, the sacrificial dielectric portions 616 can be removed by an etch process performed prior to deposition of the continuous dielectric material layer, or can be removed by extending the anisotropic etch that removes the horizontal portions of the continuous dielectric material layer to physically expose top surfaces of the source regions. Any remaining portion of the continuous dielectric material layer can be incorporated into an insulating spacer 74. Each insulating spacer 74 includes a dielectric material, which can comprise, for example, silicon oxide, silicon nitride, a dielectric metal oxide, a dielectric metal oxynitride, or a combination thereof. The thickness of each insulating spacer 74, as measured at a bottom portion thereof, can be in a range from 1 nm to 50 nm, although lesser and greater thicknesses can also be employed. In one embodiment, the thickness of the insulating spacer 74 can be in a range from 3 nm to 10 nm.

The at least one conductive material can be subsequently deposited in the cavity surrounded by the insulating spacer 74. In one embodiment, the at least one conductive material can include a metallic liner material such as a conductive metallic nitride or a conductive metallic carbide, and a metallic fill material such as W, Cu, Al, Co, Ru, and alloys thereof. For example, a metallic liner material layer and a metallic fill material layer can be sequentially deposited to fill the backside trench 79. Portions of the at least one conductive material above the horizontal plane including the top surface of the at least one contact level dielectric layer (71, 73) can be removed by a planarization process. In one embodiment, the planarization process can be a chemical mechanical planarization (CMP) process that employs one of the at least one contact level dielectric layer (71, 73) as a stopping layer. A backside contact via structure 76 can be formed within each the insulating spacer 74. The backside contact via structures 76 are herein referred to as backside contact via structures or source contact via structures (i.e., contact via structures that contact source regions 61).

Figure 11A:
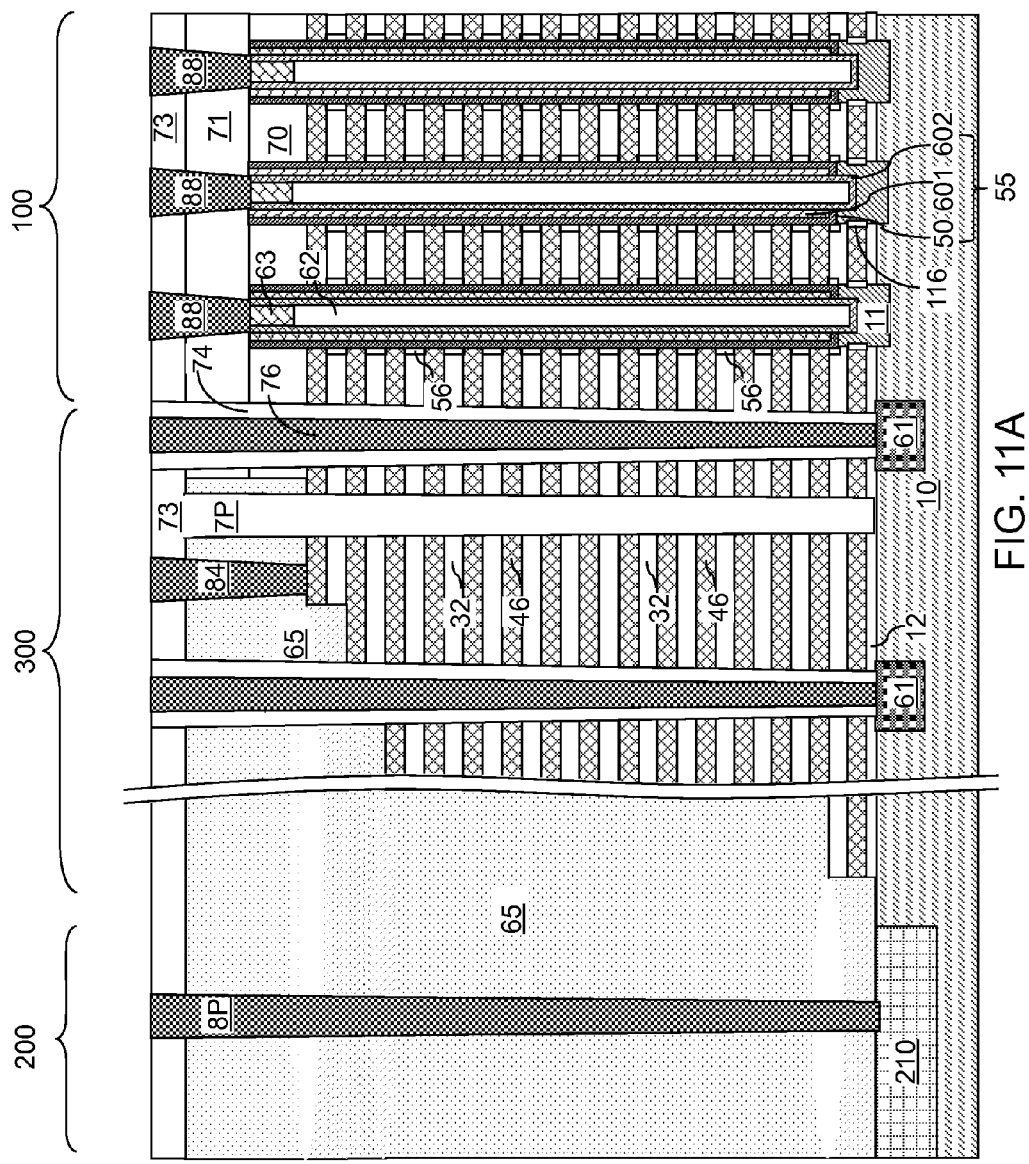
FIG. 11A is a vertical cross-sectional view of the first exemplary structure after formation of various contact via structures according to the first exemplary structure of the present disclosure.
Figure 11B:
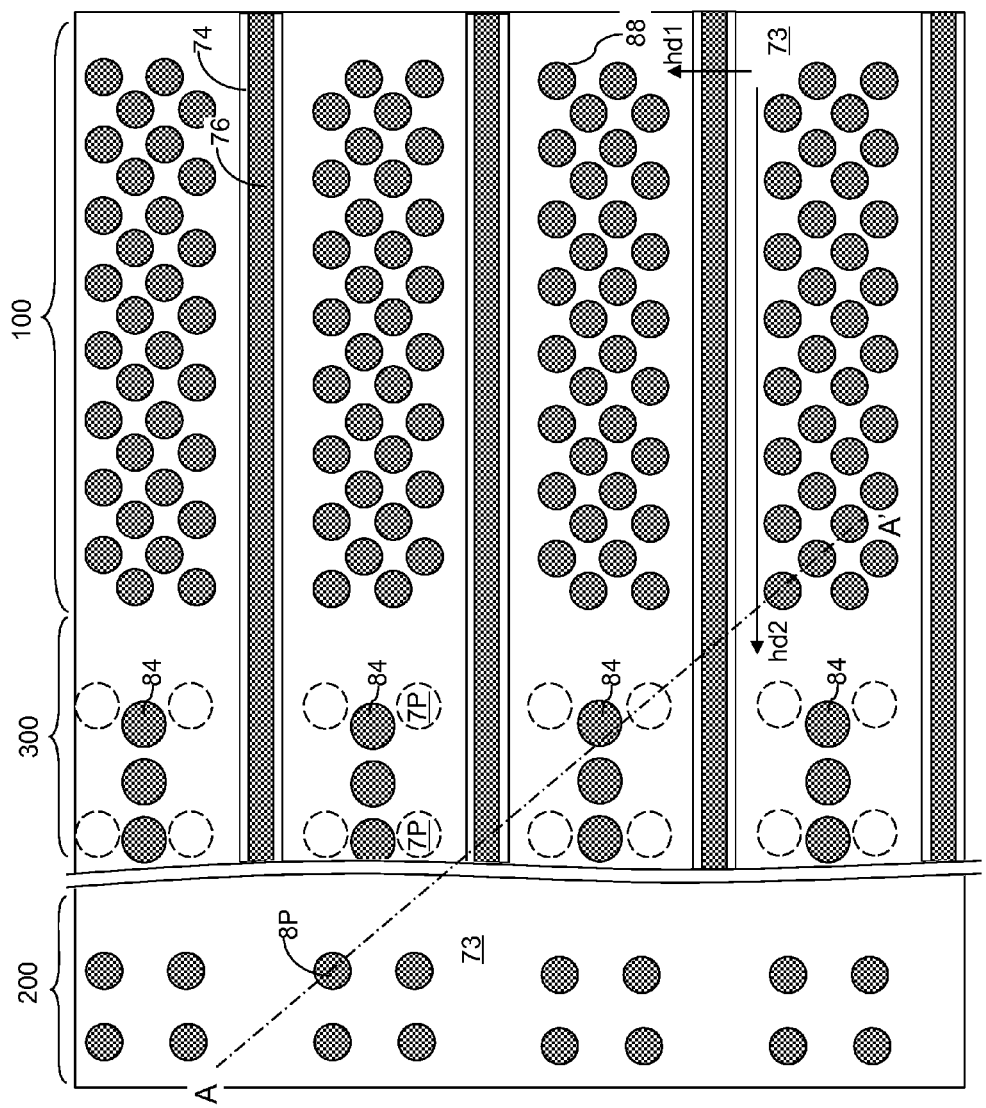
FIG. 11B is a see-through top-down view of the first exemplary structure of FIG. 11A. The vertical plane A-A' is the plane of the vertical cross-sectional view of FIG. 11A.

Referring to FIGS. 11A and 11B, a photoresist layer (not shown) can be applied over the topmost layer of the first exemplary structure (which can be, for example, the second contact level dielectric layer 73), and can be lithographically patterned to form various openings in the device region 100, the peripheral device region 200, and the contact region 300. The locations and the shapes of the various openings are selected to correspond to electrical nodes of the various devices to be electrically contacted by contact via structures. In one embodiment, a single photoresist layer may be employed to pattern all openings that correspond to the contact via cavities to be formed, and all contact via cavities can be simultaneously formed by at least one anisotropic etch process that employs the patterned photoresist layer as an etch mask. In another embodiment, a plurality of photoresist layers may be employed in combination with a plurality of anisotropic etch processes to form different sets of contact via cavities with different patterns of openings in the photoresist layers. The photoresist layer(s) can be removed after a respective anisotropic etch process that transfers the pattern of the openings in the respective photoresist layer through the underlying dielectric material layers and to a top surface of a respective electrically conductive surface.

In an illustrative example, drain contact via cavities can be formed over each memory stack structure 55 in the device region 100 such that a top surface of a drain region 63 is physically exposed at the bottom of each drain contact via cavity. Word line contact via cavities can be formed to the stepped surfaces of the alternating stack (32, 46) such that a top surface of an electrically conductive layer 46 is physically exposed at the bottom of each word line contact via cavity in the contact region 300. A device contact via cavity can be formed to each electrical node of the peripheral devices 210 to be contacted by a contact via structure in the peripheral device region.

The various via cavities can be filled with at least one conductive material, which can be a combination of an electrically conductive metallic liner material (such as TiN, TaN, or WN) and a metallic fill material (such as W, Cu, or Al). Excess portions of the at least one conductive material can be removed from above the at least one contact level dielectric layer (71, 73) by a planarization process, which can include, for example, chemical mechanical planarization (CMP) and/or a recess etch. Drain contact via structures 88 can be formed on the respective drain regions 63. Word line contact via structures 84 can be formed on the respective electrically conductive layers 46. Peripheral device contact via structures 8P can be formed on the respective nodes of the peripheral devices 210. Additional metal interconnect structures (not shown) and interlayer dielectric material layers (not) shown can be formed over the first exemplary structure to provide electrical wiring among the various contact via structures.

The first exemplary structure includes a three-dimensional memory device that comprises an alternating stack of insulating layers 32 and electrically conductive layers 46 and located over a substrate (e.g., semiconductor substrate layer 10); a memory stack structure 55 extending through the alternating stack (32, 46) and comprising, from outside to inside, a blocking dielectric 503, memory elements (e.g., charge storage regions) as embodied in a memory material layer 504, a tunneling dielectric 506, and a polycrystalline semiconductor channel 60; and annular silicon nitride spacers 52 located at each level of the insulating layers 32, vertically spaced from one another, and contacting an outer sidewall of the blocking dielectric 503. Annular silicon oxide spacers 51 can be located at each level of the insulating layers 32, vertically spaced from one another, and contact an outer sidewall of a respective silicon nitride spacer 52. Each of the annular silicon oxide spacers 51 can contact a sidewall of a respective insulating layer 32. The annular silicon oxide spacers 51 can include carbon at an atomic concentration greater than $1.0 \times 10^{19}/cm^3$.

An epitaxial channel portion 11 can underlie the memory stack structure 55 and can contact the polycrystalline semiconductor channel 60. The interface between the epitaxial channel portion 11 and one of the insulating layers 32 can be laterally offset outward from a vertical plane including the outer sidewall of the blocking dielectric 503. A semiconductor substrate layer 10 can be located in or on the substrate. The semiconductor substrate layer 10 can comprise a single crystalline semiconductor material in epitaxial alignment with the epitaxial channel portion 11. A vertical interface between the epitaxial channel portion 11 and the semiconductor substrate layer 10 can be laterally offset outward from a vertical plane including the outer sidewall of the blocking dielectric 503.

A silicon nitride plate 152 (shown in FIGS. 9A-9C) can contact a portion of a sidewall of, and can laterally surround, the polycrystalline semiconductor channel 60. The silicon nitride plate 152 can overlie the epitaxial channel portion 11, and can have the same composition and the same thickness as the silicon nitride spacers 52. A silicon oxide plate 151 can contact another portion of the sidewall of, and can laterally surround, the polycrystalline semiconductor channel 60. The silicon oxide plate 151 can underlie the silicon nitride plate 152, and can contact a top surface of the epitaxial channel portion 11. The annular silicon oxide spacers 51 can be located at each level of the insulating layers 32, can be vertically spaced from one another, and can contact an outer sidewall of a respective silicon nitride spacer 52. The silicon oxide plate 151 can have the same composition and the same thickness as the silicon oxide spacers 51.

In some embodiment, a backside blocking dielectric layer 58 can contact horizontal surfaces of the insulating layers 32. Each of the electrically conductive layers 46 can be laterally spaced from the blocking dielectric 503 by the backside blocking dielectric layer 58. Each of the electrically conductive layers 46 in physical contact with a respective portion of the outer sidewall of the blocking dielectric 503.

In one embodiment, the device located on the semiconductor substrate can include a vertical NAND device located in the device region 100, and at least one of the electrically conductive layers 46 in the stack (32, 46) can comprise, or can be electrically connected to, a word line of the NAND device. The device region 100 can include a plurality of semiconductor channels 60. At least one end portion of each of the plurality of semiconductor channels 60 extends substantially perpendicular to a top surface of the semiconductor substrate. The device region 100 further includes a plurality of charge storage regions located within each memory layer 50. Each charge storage region is located adjacent to a respective one of the plurality of semiconductor channels 60. The device region 100 further includes a plurality of control gate electrodes having a strip shape extending substantially parallel to the top surface of the substrate (e.g., substrate semiconductor layer 10). The plurality of control gate electrodes comprise at least a first control gate electrode located in the first device level and a second control gate electrode located in the second device level. The plurality of electrically conductive layers 46 in the stack (32, 46) can be in electrical contact with, or can comprise, the plurality of control gate electrodes, and extends from the device region 100 to a contact region 300 including a plurality of electrically conductive contact via structures.

In case the first exemplary structure includes a three-dimensional NAND device, a stack (32, 46) of an alternating plurality of word lines 46 and insulating layers 32 can be located over a semiconductor substrate. Each of the word lines 46 and insulating layers 32 is located at different levels that are vertically spaced from a top surface of the semiconductor substrate by different distances. An array of memory stack structures 55 is embedded within the stack (32, 46).

Each memory stack structure 55 comprises a semiconductor channel 60 (e.g., comprising layers 601, 602) and at least one charge storage region located adjacent to the semiconductor channel 60. At least one end portion of the semiconductor channel 60 extends substantially perpendicular to the top surface of the semiconductor substrate through the stack (32, 46).

Referring to FIG. 12A, a second exemplary structure according to a second embodiment of the present disclosure can be derived from the exemplary structure of FIGS. 1 and 2A. The processing steps of FIG. 2B can be subsequently performed to form epitaxial channel portions 11. At least one silicon oxide portion is provided at a periphery of each memory opening 49 so that all surfaces of each memory opening 49 are silicon oxide surfaces after formation of the at least one silicon oxide portion. The at least one silicon oxide portion can be formed as annular silicon oxide spacers 521 at each level of the sacrificial material layers 42 by converting physically exposed surface portions of the sacrificial material layers 42 into silicon oxide. In addition, the at least one silicon oxide portion can include a silicon oxide plate 151 that is formed on the top surface of the epitaxial channel portion 11 at the bottom of each memory opening 49.

The annular silicon oxide spacers 521 and the silicon oxide plates 151 in the memory openings 49 can be formed by an oxidation process, which can be a thermal oxidation process, a plasma oxidation process, or a combination thereof (e.g., ISSG or radical oxidation). In one illustrative example, the sacrificial material layers 42 can include a silicon nitride material, and the annular silicon oxide spacers 521 can be formed by oxidation of the silicon nitride material. In this case, the annular silicon oxide spacers 521 may have a radial concentration gradient of residual nitrogen atoms such that the concentration of nitrogen atoms increases radially, while the predominant non-metal element of oxygen has a concentration that decreases radially. In another illustrative example, the sacrificial material layers 42 can include a silicon-rich semiconductor material (i.e., a semiconductor material including silicon at an atomic concentration greater than 50%, such as polysilicon or amorphous silicon), and the annular silicon oxide spacers 521 can be formed by oxidation of the silicon-rich semiconductor material to form a silicon oxide material. The thickness of the annular silicon oxide spacers 521 can be in a range from 1 nm to 20 nm (such as from 2 nm to 10 nm), although lesser and greater thicknesses can also be employed.

Referring to FIG. 12B, the processing steps FIG. 2D can be performed to form a silicon nitride layer 502 within each memory opening 49. In one embodiment, the silicon nitride layer 502 can be formed by deposition of a silicon nitride material by a conformal deposition method.

A portion of silicon oxide is formed remains between the bottommost surface of the silicon nitride layer 502 and the top surface of the epitaxial channel portion 11 within each memory opening. This unetched portion of the silicon oxide layer 501 is herein referred to as a silicon oxide plate 151, which is present on a top surface of a respective epitaxial channel portion 11 after formation of the annular silicon oxide spacers 51.

Referring to FIG. 12C, the processing steps of FIG. 2E can be performed to sequentially deposit a blocking dielectric layer 503L, a memory material layer 504L, and a first semiconductor channel layer 601L.

Referring to FIG. 12D, the processing steps of FIGS. 2F-2J can be performed to form memory stack structures 55 (i.e., 50, 60) within the memory openings 49.

Subsequently, the processing steps of FIGS. 4, 5, 6A and 6B can be performed.

Referring to FIG. 13A, the processing steps of FIG. 7A can be performed to etch the sacrificial material layers 42 selective to the insulator layers 32 and the annular silicon oxide spacers 521 (which are a subset of the at least one silicon oxide portion formed at the processing steps of FIG. 12A). The silicon oxide spacers 521 function as an etch stop during the etching step.

Referring to FIG. 13B, physically exposed portions of the at least one silicon oxide portion (i.e., the annular silicon oxide spacers 521) are removed selective to the silicon nitride layer from the backside recesses 43 employing the processing steps of FIG. 7B. The silicon nitride layer 502 functions as an etch stop during the etching step. In one embodiment, all of the annular silicon oxide spacers 521 can be removed during removal of the exposed portions of the at least one silicon oxide portion.

Referring to FIG. 13C, the processing steps of FIG. 7C can be optionally performed to form dielectric spacers 116 and sacrificial dielectric portions 616.

In one embodiment, the processing steps of FIG. 7D can be performed to remove physically exposed portions of the silicon nitride layer 502 selective to the insulating layers 32 and the memory stack structures (50, 60). Specifically, the etch chemistry employed to etch the physically exposed portions of the silicon nitride layer 502 can be selective to the dielectric material of the blocking dielectrics 503, which can include silicon oxide and/or a dielectric metal oxide.

In another embodiment illustrated in FIG. 13D, rather than etching portions of the silicon nitride layer 502 exposed in the backside recesses 43, the portions of the silicon nitride layer exposed in the backside recesses are converted to silicon oxide portions 251 using any suitable oxidation process. For example, the silicon oxide portions 251 may be formed by oxidizing the exposed portions of the silicon nitride layer 502 using ISSG or another oxidation method through the backside trench 79 and recesses 43. The silicon oxide portions 251 form annular spacers in contact with the blocking dielectric 503 adjacent to the backside recesses 43. The spacers 251 may comprise portions of the blocking dielectric which are located between the silicon nitride spacers 52. Thus, the combined blocking dielectric (503, 251) is thicker between the insulating layers 32 than the blocking dielectric 503 adjacent to the insulating layers 32.

Unetched or unoxidized portions of the silicon nitride layer 502 remain as annular silicon nitride spacers 52 at each level of the insulating layers 32 and at the level of the dielectric cap layer 70 after removal of the physically exposed portions of the silicon nitride layer 502. In other words, each remaining portion of the silicon nitride layer 502 located above the top surface of the epitaxial channel portions 11 constitutes a silicon nitride spacer 52. The annular silicon nitride spacers 52 are present at each level of the insulating layers 32 and at the level of the dielectric cap layer 70.

An unetched or unoxidized portion of the silicon nitride layer 502 remains between the top surface of the silicon oxide plate 151 and the bottommost surface of the blocking dielectric 503 within each memory opening. This unetched or unoxidized portion of the silicon nitride layer 502 is herein referred to as a silicon nitride plate 152, which is present over a respective epitaxial channel portion 11 and on a top surface of a respective silicon oxide plate 151. In this embodiment, the annular silicon oxide spacers 51 may be omitted from the final device. Within each memory opening, the memory stack structure 55 (i.e., 50, 60) comprises a tunneling dielectric 506, and the topmost surface of the silicon oxide plate 151 is located below the horizontal plane including the bottommost surface of the tunneling dielectric 506. Each vertical stack of a silicon oxide plate 151 and a silicon nitride plate 152 is herein referred to as a dielectric plate structure (151, 152).

Subsequently, the processing steps employed to form the structures of FIG. 9A, 9B, or 9C can be performed to form the structures of FIG. 14A, 14B, or 14C, respectively. Specifically, at least one metallic material can be deposited in the backside recesses 43 and over the sidewalls of the backside trenches 79 to form the electrically conductive layers 46.

Figure 14C:
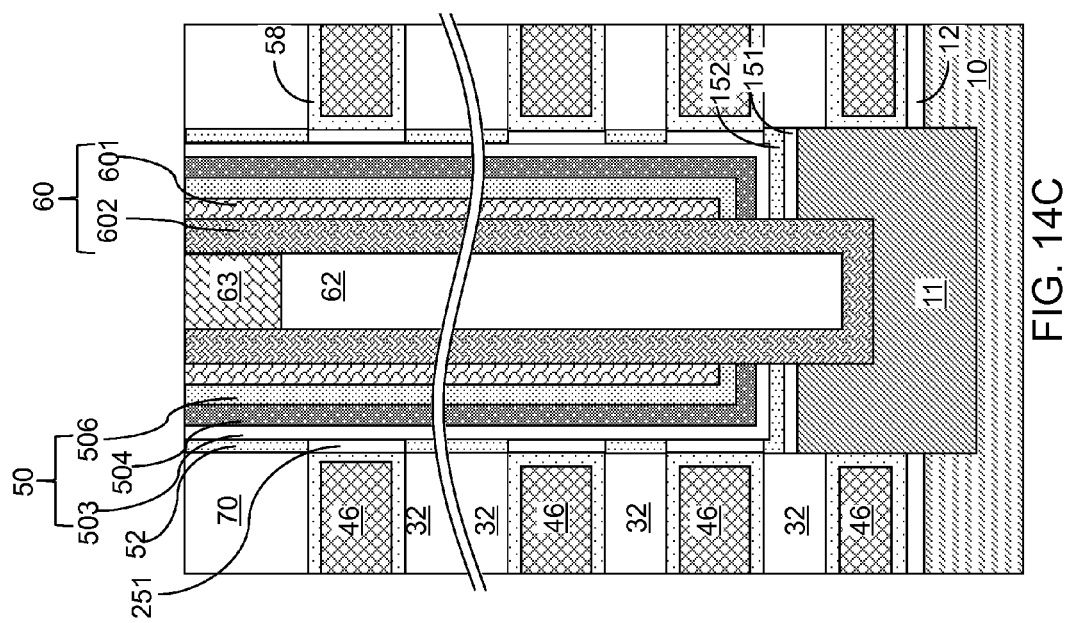

In one embodiment, the at least one metallic material can be deposited directly on the sidewalls and horizontal surfaces of the insulating layers 32, the physically exposed surfaces of the annular silicon nitride spacers 52, and physically exposed portions of the outer sidewalls of the memory films 50 (e.g., on the spacer portions 251 of the blocking dielectric (503, 251), as illustrated in FIG. 14A. Alternatively, a backside blocking dielectric layer 58 can be formed in the backside recesses 43 in contact with the spacer portions 251, on the sidewalls of the backside trenches 79, and over the top surface of the at least one contact level dielectric layer (71, 73) prior to deposition of the at least one metallic material as illustrated in FIG. 14B or 14C. FIG. 14B illustrates an embodiment in which dielectric spacers 116 and sacrificial dielectric portions 616 are employed. FIG. 14C illustrates an embodiment in which dielectric spacers 116 and sacrificial dielectric portions 616 are omitted.

Vertically-extending portions of the deposited metallic material(s) can cover the entirety of the sidewall of the backside trench 79. As deposited, a vertically-extending portion of the deposited metallic material(s) can be continuously adjoined to metal portions located within each vertically neighboring pair of backside recesses 43, and can be adjoined to a horizontal portion of the metal layer that overlies the at least one contact level dielectric layer (71, 73). A backside blocking dielectric layer 58 can contact horizontal surfaces of the insulating layers 32 such that each of the electrically conductive layers 46 is laterally spaced from the blocking dielectrics (503, 251) by the backside blocking dielectric layer 58 as illustrated in FIGS. 14B and 14C. Alternatively, each of the electrically conductive layers 46 can be in physical contact with a respective spacer portion 251 of the outer sidewall of the blocking dielectric (503, 251), as illustrated in FIG. 14A.

Figure 15:
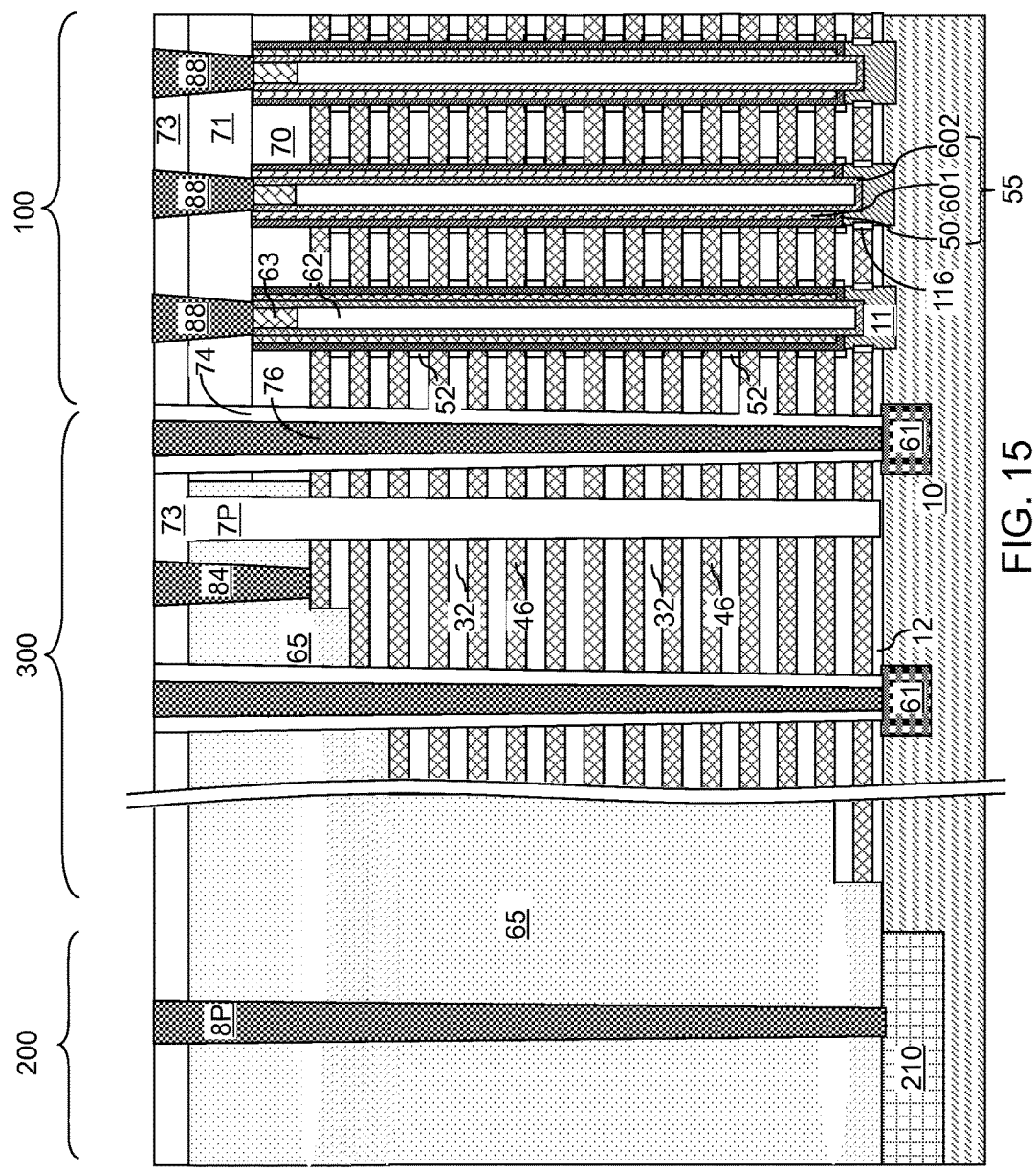
FIG. 15 is a vertical cross-sectional view of the second exemplary structure after formation of various contact via structures according to the second exemplary structure of the present disclosure.

Referring to FIG. 15, the processing steps of FIG. 10 can be subsequently performed to form insulating spacers 74 and backside contact via structures 76. Various via cavities can be formed in the same manner as in the first embodiment. The various via cavities can be filled with at least one conductive material, and excess portions of the at least one conductive material can be removed from above the at least one contact level dielectric layer (71, 73) by a planarization process to form various contact via structures.

The second exemplary structure includes a three-dimensional memory device that comprises an alternating stack of insulating layers 32 and electrically conductive layers 46 and located over a substrate; a memory stack structure 55 extending through the alternating stack (32, 46) and comprising, from outside to inside, a blocking dielectric 503, memory elements as embodied in a memory material layer 504, a tunneling dielectric 506, and a polycrystalline semiconductor channel 60; and annular silicon nitride spacers 52 located at each level of the insulating layers 32, vertically spaced from one another, and contacting an outer sidewall of the blocking dielectric 503. Each of the annular silicon nitride spacers 52 can contact a sidewall of a respective insulating layer 32. If the silicon nitride layer 502 is formed by nitridation of a silicon oxide material, the annular silicon nitride spacers 52 can have a lateral concentration gradient such that oxygen concentration in each of the annular silicon nitride spacers 52 increases with a lateral distance from a respective inner sidewall thereof. If the silicon nitride layer 502 is formed by deposition of a silicon nitride material, the annular silicon nitride spacers 52 can have a homogeneous composition throughout.

An epitaxial channel portion 11 can underlie the memory stack structure 55 and can contact the polycrystalline semiconductor channel 60. The vertical interface 605 between the epitaxial channel portion 11 and one of the insulating layers 32 can be laterally offset outward from a vertical plane 607 including the outer sidewall of the blocking dielectric 503. A semiconductor material layer 10 can be located in the substrate. The semiconductor material layer 10 can comprise a single crystalline semiconductor material in epitaxial alignment with the epitaxial channel portion 11. Another vertical interface 609 between the epitaxial channel portion 11 and the semiconductor material layer 10 can be laterally offset outward from the vertical plane 607 including the outer sidewall of the blocking dielectric 503.

A silicon nitride plate 152 (See FIGS. 14A-14C) can contact a portion of a sidewall of, and can laterally surround, the polycrystalline semiconductor channel 60. The silicon nitride plate 152 can overlie the epitaxial channel portion 11, and can have the same composition and the same thickness as the silicon nitride spacers 52. A silicon oxide plate 151 can contact another portion of the sidewall of, and can laterally surround, the polycrystalline semiconductor channel 60. The silicon oxide plate 151 can underlie the silicon nitride plate 152, and can contact a top surface of the epitaxial channel portion 11.

In some embodiments, a backside blocking dielectric layer 58 can contact horizontal surfaces of the insulating layers 32 and the silicon oxide spacer portions 251. Each of the electrically conductive layers 46 can be laterally spaced from the blocking dielectric (503, 251) by the backside blocking dielectric layer 58. Each of the electrically conductive layers 46 in physical contact with a respective portion of the outer sidewall of the blocking dielectric 503.

In one embodiment, the device located on the semiconductor substrate can include a vertical NAND device located in the device region 100, and at least one of the electrically conductive layers 46 in the stack (32, 46) can comprise, or can be electrically connected to, a word line of the NAND device. The device region 100 can include a plurality of semiconductor channels 60 (e.g., 601, 602). At least one end portion of each of the plurality of semiconductor channels 60 extends substantially perpendicular to a top surface of the semiconductor substrate. The device region 100 further includes a plurality of charge storage regions located within each memory layer 50. Each charge storage region is located adjacent to a respective one of the plurality of semiconductor channels 60. The device region 100 further includes a plurality of control gate electrodes having a strip shape extending substantially parallel to the top surface of the substrate (e.g., substrate semiconductor layer 10). The plurality of control gate electrodes comprise at least a first control gate electrode located in the first device level and a second control gate electrode located in the second device level. The plurality of electrically conductive layers 46 in the stack (32, 46) can be in electrical contact with, or can comprise, the plurality of control gate electrodes, and extends from the device region 100 to a contact region 300 including a plurality of electrically conductive contact via structures.

In case the second exemplary structure includes a three-dimensional NAND device, a stack (32, 46) of an alternating plurality of word lines 46 and insulating layers 32 can be located over a semiconductor substrate. Each of the word lines 46 and insulating layers 32 is located at different levels that are vertically spaced from a top surface of the semiconductor substrate by different distances. An array of memory stack structures 55 is embedded within the stack (32, 46). Each memory stack structure 55 comprises a semiconductor channel 60 (e.g., 601, 602) and at least one charge storage region located adjacent to the semiconductor channel 60. At least one end portion of the semiconductor channel 60 extends substantially perpendicular to the top surface of the semiconductor substrate through the stack (32, 46).

As described above, the backside recesses can be formed employing the silicon oxide portions as an etch stop. The silicon oxide portions can be subsequently removed employing the silicon nitride layer as an etch stop. Physically exposed portions of the silicon nitride layer can be removed selective to the memory stack structure. Damage to the outer layer of the memory stack structure can be minimized or eliminated by successive use of etch stop structures. Electrically conductive layers can be subsequently formed in the backside recesses. Thus, cover silicon oxide layer 501 and/or cover silicon nitride layer 502 act as vertical etch stop layers to prevent or reduce over etching of the blocking dielectric layer 503 located in the memory opening 49 during the removal of the sacrificial material layers 42.

Furthermore, the second embodiment provides a thicker blocking dielectric adjacent to the control gate electrodes 46 of each NAND string by including the spacer blocking dielectric portions 251 which are located between the vertically separated silicon nitride spacers 52 and adjacent to the electrically conductive layers (e.g., the control gate electrodes) 46. The spacer blocking dielectric portions 251 contact the blocking dielectric layer 503 to form a combined blocking dielectric (503, 251). The combined blocking dielectric has blocking dielectric layer 503 portions in the memory opening 49 located adjacent to the insulating layers 32 of the stack (32, 46) which are thinner than the combined blocking dielectric layer 503 and spacer 251 portions located adjacent to the control gate electrodes 46 between the silicon nitride spacers 52. This reduces the overall thickness of the blocking dielectric in the memory opening and permits a smaller diameter memory opening without decreasing the thickness of the blocking dielectric adjacent to the control gate electrodes where a thicker blocking dielectric may be desired.

The hybrid blocking oxide in memory (BOXIM) opening of the first and second embodiments also allows a bigger process margin, avoids the bird's beak blocking dielectric shape in the backside recess, and permits a smaller memory opening diameter due to the smaller layer thickness which improves device layer resistivity and device threshold voltage. The process of the second embodiment provides an easier etch of the layers from the bottom of the memory opening and provides a high quality oxide spacers 251 formed by oxidation of silicon nitride.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device comprising:
   an alternating stack of insulating layers and electrically conductive layers and located over a substrate;
   a memory stack structure extending through the alternating stack and comprising, from outside to inside, a blocking dielectric, memory elements, a tunneling dielectric, and a semiconductor channel; and
   annular silicon nitride spacers located at each level of the insulating layers, vertically spaced from one another, and contacting an outer sidewall of the blocking dielectric.

2. The three-dimensional memory device of claim 1, further comprising annular silicon oxide spacers located at each level of the insulating layers, vertically spaced from one another, and contacting an outer sidewall of a respective silicon nitride spacer.

3. The three-dimensional memory device of claim 2, wherein each of the annular silicon oxide spacers contacts a sidewall of a respective insulating layer.

4. The three-dimensional memory device of claim 2, wherein the annular silicon oxide spacers include carbon at an atomic concentration greater than $1.0 \times 10^{19}/cm^3$.

5. The three-dimensional memory device of claim 1, further comprising spacer blocking dielectric portions which are located between the silicon nitride spacers adjacent to the electrically conductive layers.

6. The three-dimensional memory device of claim 5, wherein the blocking dielectric comprises the spacer blocking dielectric portions which contact a blocking dielectric layer to form a combined blocking dielectric which is thinner adjacent to the insulating layers than adjacent to the electrically conductive layers.

7. The three-dimensional memory device of claim 1, wherein the annular silicon nitride spacers have a lateral concentration gradient such that oxygen concentration in each of the annular silicon nitride spacers increases with a lateral distance from a respective inner sidewall thereof.

8. The three-dimensional memory device of claim 1, wherein the annular silicon nitride spacers have a homogeneous composition throughout.

9. The three-dimensional memory device of claim 1, further comprising a single crystal silicon epitaxial channel portion underlying the memory stack structure and contacting the semiconductor channel which comprises polysilicon.

10. The three-dimensional memory device of claim 9, wherein an interface between the epitaxial channel portion and one of the insulating layers is laterally offset outward from a vertical plane including the outer sidewall of the blocking dielectric.

11. The three-dimensional memory device of claim 9, further comprising a semiconductor material layer located in the substrate and comprising a single crystalline semiconductor material in epitaxial alignment with the epitaxial channel portion, wherein a vertical interface between the epitaxial channel portion and the semiconductor material layer is laterally offset outward from a vertical plane including the outer sidewall of the blocking dielectric.

12. The three-dimensional memory device of claim 9, further comprising a silicon nitride plate contacting a portion of a sidewall of, and laterally surrounding the polycrystalline semiconductor channel, and overlying the epitaxial channel portion, and having a same composition and a same thickness as the silicon nitride spacers.

13. The three-dimensional memory device of claim 12, further comprising a silicon oxide plate underlying the silicon nitride plate, and contacting a top surface of the epitaxial channel portion and laterally surrounding the polycrystalline semiconductor channel.

14. The three-dimensional memory device of claim 13, further comprising annular silicon oxide spacers located at each level of the insulating layers, vertically spaced from one another, and contacting an outer sidewall of a respective silicon nitride spacer, wherein the silicon oxide plate has a same composition and a same thickness as the silicon oxide spacers.

15. The three-dimensional memory device of claim 1, wherein:
   the three-dimensional memory device comprises a vertical NAND device formed in a device region;
   the electrically conductive layers comprise, or are electrically connected to a respective word line of the NAND device;
   the device region comprises:
      a plurality of semiconductor channels, wherein at least one end portion of each of the plurality of semiconductor channels extends substantially perpendicular to a top surface of the substrate;
a plurality of charge storage regions, each charge storage region located adjacent to a respective one of the plurality of semiconductor channels; and
a plurality of control gate electrodes having a strip shape extending substantially parallel to the top surface of the substrate;

the plurality of control gate electrodes comprise at least a first control gate electrode located in a first device level and a second control gate electrode located in a second device level;

the electrically conductive layers in the stack are in electrical contact with the plurality of control gate electrode and extend from the device region to a contact region including the plurality of electrically conductive via connections; and the substrate comprises a silicon substrate containing a driver circuit for the NAND device.

* * * * *